US012593738B2

(12) United States Patent
Tang et al.

(10) Patent No.: US 12,593,738 B2
(45) Date of Patent: Mar. 31, 2026

(54) FLIP CHIP PACKAGE FOR SEMICONDUCTOR DEVICES

(71) Applicant: Texas Instruments Incorporated, Dallas, TX (US)

(72) Inventors: Yiqi Tang, Allen, TX (US); Jie Chen, Plano, TX (US); Chittranjan Mojan Gupta, Richardson, TX (US); Rajen Muricon Murugan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 873 days.

(21) Appl. No.: 17/710,912

(22) Filed: Mar. 31, 2022

(65) Prior Publication Data

US 2023/0317581 A1 Oct. 5, 2023

(51) Int. Cl.
*H01L 23/498* (2006.01)
*H01L 23/00* (2006.01)

(52) U.S. Cl.
CPC .. *H01L 23/49816* (2013.01); *H01L 23/49822* (2013.01); *H01L 23/49838* (2013.01); *H01L 24/16* (2013.01); *H01L 24/81* (2013.01); *H01L 24/32* (2013.01); *H01L 24/73* (2013.01); *H01L 2224/16227* (2013.01); *H01L 2224/32225* (2013.01); *H01L 2224/73204* (2013.01); *H01L 2924/15311* (2013.01)

(58) Field of Classification Search
CPC ......... H01L 23/49816; H01L 23/49822; H01L 23/49838
See application file for complete search history.

(56) References Cited

U.S. PATENT DOCUMENTS

| | | | |
|---|---|---|---|
| 5,543,661 | A | 8/1996 | Sumida |
| 2005/0017357 | A1 | 1/2005 | Tida et al. |
| 2018/0030142 | A1 | 2/2018 | Majeti et al. |

FOREIGN PATENT DOCUMENTS

EP 0614220 A2 9/1994

OTHER PUBLICATIONS

PCT Search Report PCT/US2023/016182 mailed Jun. 6, 2023, 3 pages.

*Primary Examiner* — Errol V Fernandes
(74) *Attorney, Agent, or Firm* — Xiaotun Qiu; Frank D. Cimino

(57) ABSTRACT

In a described example, an apparatus includes: a multilayer package substrate including a die mount area on a die side surface and comprising power pads and ground pads on an opposing board side surface, the multilayer package substrate including post connect locations on the die side surface for receiving power post connects and for receiving ground post connects for a flip chip mounted semiconductor device, the power post connect locations and the ground post connect locations positioned in the die mount area, the power post connect locations and the ground post connect locations intermixed in the die mount area; and a semiconductor device having post connects extending from bond pads on a device side surface of the semiconductor device mounted to the die side surface of the multilayer package substrate by solder joints between the post connects and the post connect locations.

20 Claims, 19 Drawing Sheets

FROM STEP 409 FIG. 4A

604

610                610

| VSS | 606 |

621

| VSS | 606 | | VDD | 607 | | VSS | 606 |

| VSS | 606 |

651

$L_a$

653    $L_{ab}$

D $L_b$ $$L_{loop} = L_a - L_{ab} + L_b - L_{ab} = L_a + L_b - 2L_{ab}$$

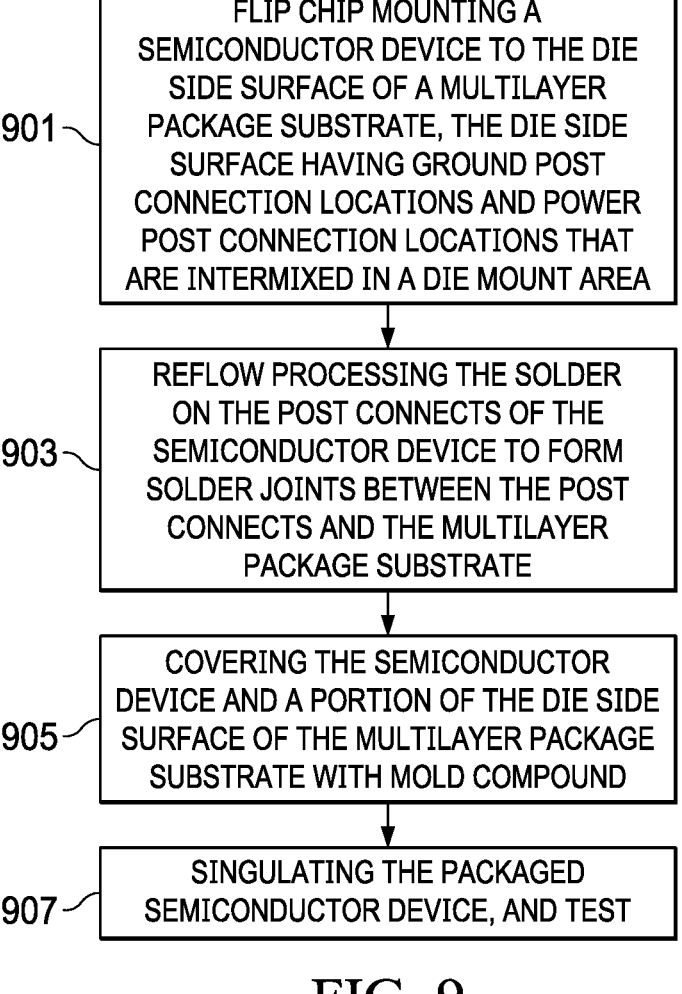

901 — FLIP CHIP MOUNTING A SEMICONDUCTOR DEVICE TO THE DIE SIDE SURFACE OF A MULTILAYER PACKAGE SUBSTRATE, THE DIE SIDE SURFACE HAVING GROUND POST CONNECTION LOCATIONS AND POWER POST CONNECTION LOCATIONS THAT ARE INTERMIXED IN A DIE MOUNT AREA

903 — REFLOW PROCESSING THE SOLDER ON THE POST CONNECTS OF THE SEMICONDUCTOR DEVICE TO FORM SOLDER JOINTS BETWEEN THE POST CONNECTS AND THE MULTILAYER PACKAGE SUBSTRATE

905 — COVERING THE SEMICONDUCTOR DEVICE AND A PORTION OF THE DIE SIDE SURFACE OF THE MULTILAYER PACKAGE SUBSTRATE WITH MOLD COMPOUND

907 — SINGULATING THE PACKAGED SEMICONDUCTOR DEVICE, AND TEST

FIG. 9

FLIP CHIP PACKAGE FOR SEMICONDUCTOR DEVICES

TECHNICAL FIELD

This relates generally to packaging electronic devices, and more particularly to flip chip semiconductor device packages.

BACKGROUND

Processes for producing packaged semiconductor devices include mounting the electronic devices to a package substrate, and then covering the electronic devices with a mold compound in a molding process to form protective packages. When devices are mounted on package substrates in flip chip packages, a semiconductor die has post connects that extend from bond pads on a device side surface of the semiconductor die to an end having a solder ball or solder bump. In a flip chip package, the semiconductor die is mounted with the device side surface facing a package substrate. When the semiconductor die is flip chip mounted to the package substrate, the solder bumps at the distal end of the post connects are subjected to a thermal reflow process so that the solder melts and flows to form solder joints. The solder joints mechanically attach and electrically couple the semiconductor die to the package substrate. The solder joints attach the conductive post connects to conductive areas on the package substrate.

In flip chip packages for power devices, power and ground connections are made to post connects on the semiconductor device and extending through the package substrate to external power and ground connections. For a ball grid array (BGA) package, the external power and ground connections are solder balls that are used to connect to conductive lands or pads on a printed circuit board. For a no-leads package, the external power and ground connections on the package may be conductive pads exposed from the mold compound of the package for surface mounting to corresponding lands or traces on a printed circuit board.

A loop inductance is formed between the power and ground paths through a semiconductor device package. When the loop inductance is large, performance of the packaged semiconductor device is impacted. Improved packages for semiconductor devices are needed.

SUMMARY

In a described example, an apparatus includes: a multilayer package substrate including a die mount area on a die side surface and comprising power pads and ground pads on an opposing board side surface, the multilayer package substrate including post connect locations on the die side surface for receiving power post connects and for receiving ground post connects for a flip chip mounted semiconductor device, the power post connect locations and the ground post connect locations positioned in the die mount area, the power post connect locations and the ground post connect locations intermixed in the die mount area; and a semiconductor device having post connects extending from bond pads on a device side surface of the semiconductor device mounted to the die side surface of the multilayer package substrate by solder joints between the post connects and the post connect locations.

BRIEF DESCRIPTION OF THE DRAWINGS

FIGS. 4A-4B illustrate, in a series of cross-sectional views, the major steps in manufacturing a multilayer package substrate that can be used in the arrangements.

FIG. 9 illustrates, in a flow diagram, selected steps of a method for forming the arrangements.

DETAILED DESCRIPTION

Figure 1A:
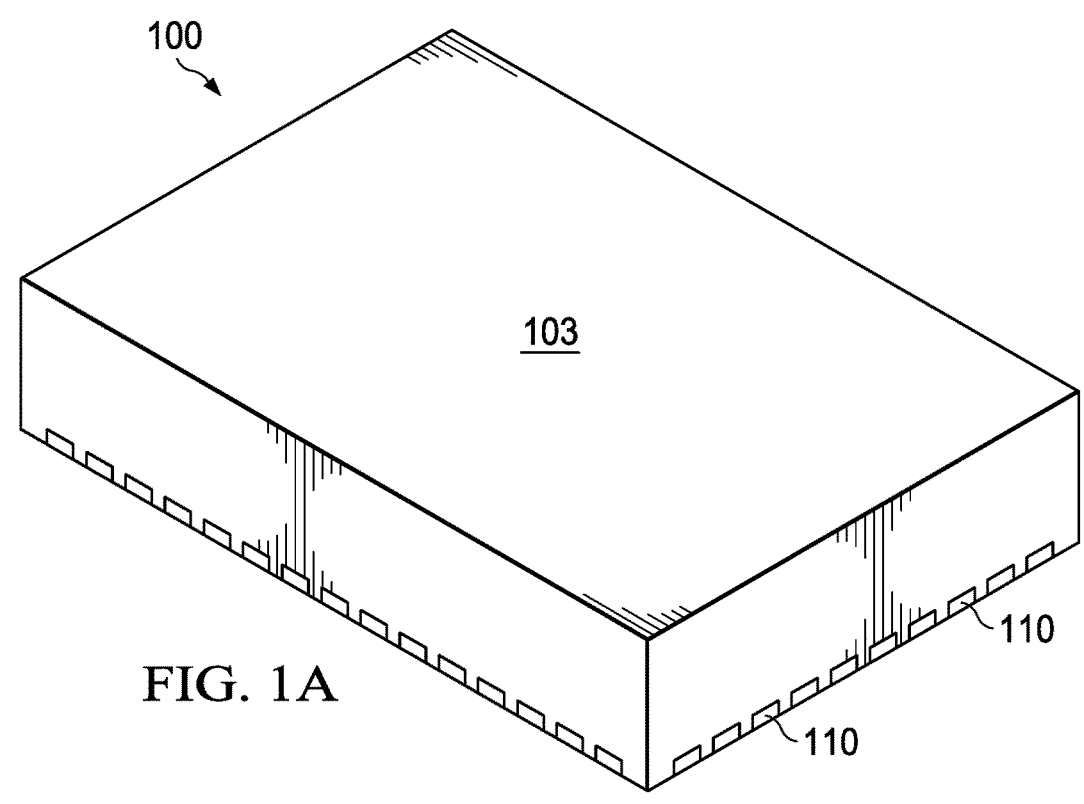
FIGS. 1A-1B are projection views from top and bottom sides, respectively, of a flip chip semiconductor device package in a quad flat no-leads (QFN) package.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor device" is used herein. As used herein, a semiconductor device can be a discrete semiconductor device such as a bipolar transistor, a few discrete devices such as a pair of power FET switches fabricated together on a single semiconductor die, or a semiconductor device can be an integrated circuit with multiple devices such as the multiple capacitors in an A/D converter. The semiconductor device can include passive devices such as resistors, inductors, filters, or active devices such as transistors. The semiconductor device can be an integrated circuit with hundreds or thousands of transistors coupled to form a functional circuit, for example a microprocessor or a memory device. The semiconductor device can be a passive device such as a sensor, example sensors include photocells, transducers, and charge coupled devices (CCDs), or can be a micro electro-mechanical system (MEMS) device, such as a digital micromirror device (DMD). The semiconductor device includes a semiconductor substrate that has a device side surface and an opposite backside surface. Semiconductor processes form devices on the device side surface of the semiconductor device. When the semiconductor device is removed from a semiconductor wafer for packaging, it can be referred to as a semiconductor die.

The term "packaged semiconductor device" is used herein. A packaged semiconductor device has at least one semiconductor device electronically coupled to terminals placed within a package body that protects and covers the semiconductor device. In some arrangements, multiple semiconductor dies can be packaged together. The semiconductor device is mounted to a package substrate that provides conductive leads, a portion of the conductive leads form the terminals for the packaged electronic device. The semiconductor device can be flip chip mounted with the device side surface facing a die side surface of a package substrate, and the semiconductor device is mounted to the leads of the package substrate by conductive post connects attached to the package substrate by solder such as solder balls or bumps. The packaged semiconductor device can have a package body formed by a thermoset epoxy resin in a molding process, or by the use of epoxy, resin or plastic that are liquid at room temperature and are subsequently cured. The package body may provide a hermetic package for the packaged semiconductor device. The package body may be formed in a mold using an encapsulation process, however, a portion of the leads of the package substrate are not covered during encapsulation, these exposed lead portions provide the terminals for the packaged semiconductor device.

The term "package substrate" is used herein. A package substrate is a substrate arranged to receive a semiconductor die and to support the semiconductor die in a completed semiconductor package. Additional semiconductor dies or other components can also be mounted to the package substrate. Package substrates include conductive leads and in some examples die pads, which can be formed from copper, aluminum, stainless steel and alloys such as Alloy 42 and copper alloys. For flip chip packages, a portion of the leads are configured to receive solder joints between the leads and the conductive post connects for the semiconductor die. The solder joints form the physical die attach and the electrical connection to the package substrate. When lead frames are used as package substrates, the lead frames can be provided in strips or arrays. Semiconductor dies can be placed on the strips or arrays, the dies flip chip mounted to the lead frames and the lead frames and dies then covered with mold compound in a molding process.

Alternative package substrates include pre-molded lead frames (PMLF) and molded interconnect substrates (MIS) for receiving semiconductor dies. Multilayer package substrates can be used, these can include multiple levels of conductors formed in dielectric material. The multilayer package substrates can include dielectrics such thermoplastic acrylonitrile butadiene styrene (ABS), acrylic styrene acrylonitrile (ASA), liquid crystal polymer (LCP), or resin epoxy mold compound, and can include layers of conductive portions with the dielectrics. The multilayer package substrates are formed in an additive manufacturing process by repeated plating and patterning operations to form multiple layers of conductors spaced by dielectric material, and conductive vertical connections are formed to connect the layers of the conductors. The vertical connections form conductors that connect conductor trace layers through the layers of dielectric. Package substrates can include lead frames, and can include plated, stamped and partially etched lead frames. In a partially etched lead frame, two levels of metal can be formed by etching a pattern from one side of a metal substrate, and then etching from the other side, to form a lead frame having full thickness and partial thickness portions, and in some areas, all of the metal can be etched through to form openings through the partially etched lead frame. The package substrate can also be tape-based and film-based, and these can form substrates carrying conductors. Ceramic substrates, laminate substrates with multiple layers of conductors and insulator layers; and printed circuit board substrates of ceramic, fiberglass or resin, or glass reinforced epoxy substrates such as flame retardant 4 (FR4) can be used as the package substrates. In example arrangements, multilayer package substrates are used as package substrates for flip chip mounted semiconductor devices.

The term "post connect" is used herein. As used herein, a post connect is a structure made of a conductive material, for example copper or copper alloys, gold or gold alloys, or combinations of conductive metal that provides a connection between a semiconductor die and a package substrate. A proximal end of the post connects is mounted to a bond pad on the device side surface of a semiconductor device, while a distal end of the post connect is extended away from the bond pad of the semiconductor device. Solder is formed as a bump on the distal end of the post connect. When the packaged semiconductor device is oriented with the semiconductor device die positioned above and facing a die mount surface of a package substrate in a flip chip orientation, the post connect makes a vertical connection between a conductive portion of the package substrate and the bond pad of the semiconductor die. Some references describe a type of post connect as a "controlled collapse chip connection" or as "C4" bumps. In the arrangements, semiconductor devices are flip chip mounted on a die mount area of a multiple layer package substrate with electrical connections from the semiconductor die to the package substrate made using post connects.

The term "intermixed" is used herein to describe post connect locations. Power post connect locations and ground post connect locations are intermixed when the two types of post connect locations are mixed together, so that for one of the power post connections, a ground post connection is within three post connect locations. In the arrangements, power post connect locations and ground post connect locations are intermixed on the die side surface of a multilayer package substrate.

In packaging semiconductor devices, a mold compound may be used to partially cover a package substrate, to cover the semiconductor die, and to cover the connections from the semiconductor die to the package substrate. This "encapsulation" process is often an injection molding process, where thermoset mold compound such as epoxy resin can be used. In an example process, a room temperature solid or powder mold compound can be heated to a liquid state, and then molding can be performed. Transfer molding can be used. Unit molds shaped to surround an individual device may be used, or block molding may be used, to form the packages simultaneously for several devices using the heated liquid mold compound. The devices can be provided in an array of several, hundreds or even thousands of devices in rows and columns that are molded together. After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device.

In flip chip device attach processes, solder balls, solder columns, or solder bumps are used to form solder joints between the conductive post connects and a conductive lead or land on a package substrate. The post connects are formed extending from bond pads of the semiconductor device. The semiconductor device is then oriented with the distal ends of the post connects facing a die mounting surface of a circuit board or package substrate. A solder reflow process is used to attach the post connects to conductive die pads or leads on the package substrate, the solder joints forming a physical attachment and an electrical connection between the package substrate and the semiconductor device.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing including packaging. This process of removing dies from a wafer is referred to as "singulation" or sometimes referred to as "dicing." Scribe lanes are arranged on four sides of semiconductor dies and when the dies are singulated from one another, rectangular semiconductor device dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and so the saw will traverse the molded electronic devices in two different directions to cut apart the packaged electronic devices from one another in the array.

The term "quad flat no-lead" or "QFN" is used herein for a type of electronic device package. A QFN package has conductive leads that are coextensive with the sides of a molded package body and the leads are on four sides. Alternative flat no-lead packages may have leads on two sides or only on one side. These can be referred to as "small outline no-lead" or "SON" packages. No lead packaged electronic devices can be surface mounted to a board. Leaded packages can be used with the arrangements where the leads extend away from the package body and are shaped to form a portion for soldering to a board. A dual in line package, or DIP, can be used with the arrangements. A small outline package or SOP can be used with the arrangements.

The term "BGA" or "ball grid array" is used herein to describe a type of semiconductor device package. In a BGA, solder balls are formed or disposed on a board side surface of the semiconductor device package. A package substrate within the semiconductor device package connects the bond pads of the semiconductor device to the balls of the BGA package. The solder balls form the terminals of the BGA package, and the BGA can be mounted to a printed circuit board by a solder reflow process. In example arrangements, multiple BGA balls can be mounted on a ground pad or a power pad for reducing resistance by increasing the current carrying capacity for the power and ground connections.

In example arrangements, a multiple layer package substrate is used to mount a power semiconductor device. An important characteristic of a power FET packaged semiconductor device is the loop inductance between power and ground connections within the packaged semiconductor device. In the arrangements, the multiple layer package substrate is configured to reduce a loop inductance. In example arrangements this reduction is accomplished by intermixing the post connects that are coupled to ground and to power potentials. In one example, a first layer of the conductors on a multiple layer package substrate has conductive lands for the post connects carrying power arranged in a mesh pattern, while the lands for the post connects to be coupled to a ground potential are in positioned openings within the mesh pattern. When the semiconductor device is mounted, the power post connects and the ground post connects are intermixed, and mutual inductance between power and ground conductors is increased.

In another example arrangement, the lands for the ground post connects on a first layer of the multiple layer package substrate are arranged in a comb structure with first fingers extending from one side of a die mount area, while the lands for the power post connects are arranged in second fingers that extend from an opposite side of the die mount area, the first fingers and the second fingers are interlaced to form the comb structure. Use of the mesh and comb structures in the post connect positions on the first layer of the multiple layer package substrate intermixes the post connections to power and to ground, so that for a post connect that is coupled to ground, a nearby post connect is coupled to power. By placing the ground post connects and the power post connects intermixed and in close proximity to one another, mutual inductance between the power and ground conductive paths is increased, which results in a lower loop inductance for the power and ground conductors.

In the arrangements, routing from the first layer on the die side surface of the multiple layer package substrate to the external terminals of the packaged semiconductor device on the board side surface is a redistribution that maps the power and ground post connections to the power and ground balls or power and ground pads on the board side terminals of the packaged device. By using the layers of the multiple layer package substrate to map the power and ground connections, the circuit board patterns for mounting the packaged semiconductor device can remain unchanged, reducing costs for using the arrangements. The arrangements result in a flip chip packaged semiconductor device with reduced loop inductance. Reduced loop inductance increases the performance of the packaged semiconductor device (when compared to packaged semiconductor devices formed without the use of the arrangements.)

FIG. 1A illustrates in a projection view a top side surface of an example packaged semiconductor device 100 shown in a quad flat no lead (QFN) package. The packaged semiconductor device 100 has a body that can be formed from a thermoset mold compound, such as thermoset epoxy resin. Other mold compounds, such as resins, epoxies, or plastics can be used. Leads 110 are part of a package substrate that supports a semiconductor die (not visible in FIG. 1A, as it is obscured by the package body) within the packaged semiconductor device 100. The leads 110 are exposed from the mold compound 103 and form electrical terminals for the packaged electronic device. The packaged semiconductor device 100 can be mounted to a circuit board using surface mount technology (SMT). Package sizes for packaged electronic devices are continually decreasing, and currently can be several millimeters on a side to less than one millimeter on a side, although larger and smaller sizes are also used. Future package sizes may be smaller.

Figure 1B:
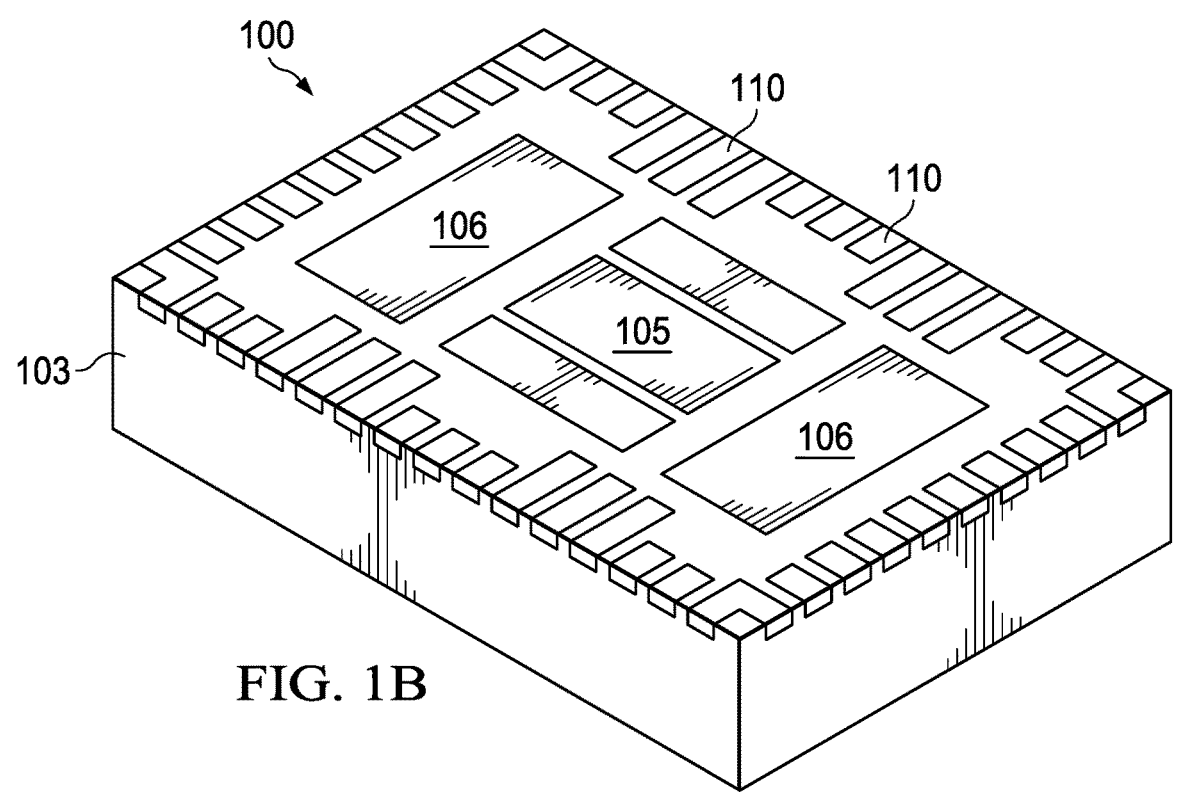

FIG. 1B illustrates a projection view a board side or bottom side of the QFN packaged semiconductor device 100 of FIG. 1A. In FIG. 1B, the packaged semiconductor device 100 includes leads 110, and VSS pads 106 which can be configured for mounting to ground potential lands on a printed circuit board, and VDD pad 105 which can be configured for mounting to a power land or power lands on a printed circuit board. The VSS pads 106 and the VDD pad 105 provide low resistance paths from the printed circuit board to the packaged semiconductor device 100. A semiconductor device die (not visible in FIG. 1B) mounted within the packaged semiconductor device 100 is then coupled to the VSS pads 106 and VDD pad 105.

Figure 1C:
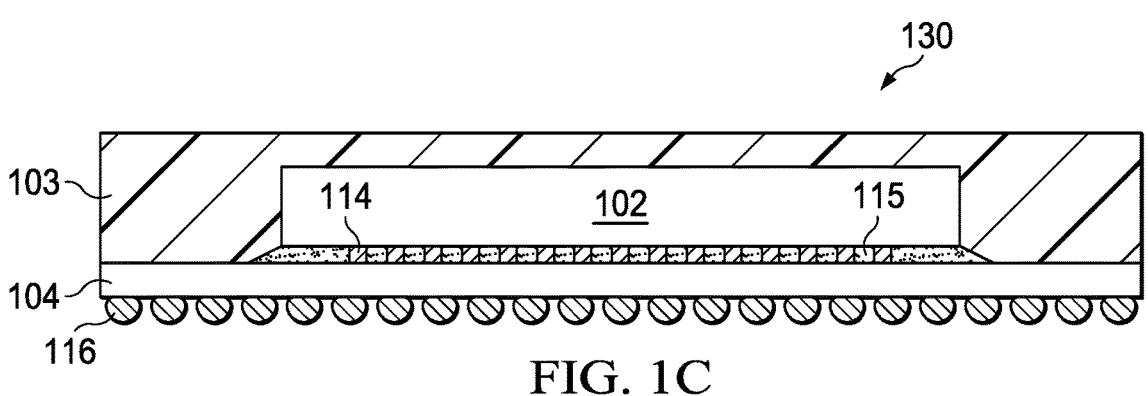
FIGS. 1C-1D are a cross-sectional view of a flip chip BGA package and a projection view of a board side of a flip chip BGA package.

FIG. 1C illustrates, in a cross sectional view, an alternative semiconductor device package 130. Package 130 is a ball grid array (BGA) package with terminals 116 that are solder balls which are configured to be mounted to a printed circuit board. A package substrate 104 is shown with a semiconductor device 102 flip chip mounted to a device side surface of the package substrate 104. The package substrate 104 has the solder balls forming terminals 116 mounted on a board side surface that is opposite the device side surface of the package substrate 104. The semiconductor device 102 has post connects 114 extending from the semiconductor device 102 to the device side surface of the package substrate 104. The post connects 114 can be solder bumps, pillar bumps, copper pillar bumps, and in one example, copper pillar bumps are used with a copper portion extending from with a proximate end on bond pads of the semiconductor device 102 and ending at a distal end in a solder portion (not visible in FIG. 1C) that can be formed by solder plating or by a solder ball drop process. An underfill 115 is dispensed between the semiconductor device 102 and the package substrate 104, and protects solder joints formed between the semiconductor device 102 and the package substrate 104, in alternative approaches underfill 115 may be omitted. The packaged semiconductor device 130 has a package body formed by mold compound 103, the packaged semiconductor device 130 can be described as "overmolded" as the mold compound 103 is formed on the package substrate 104 over the semiconductor device 102 after the semiconductor device 102 is mounted.

Figure 1D:
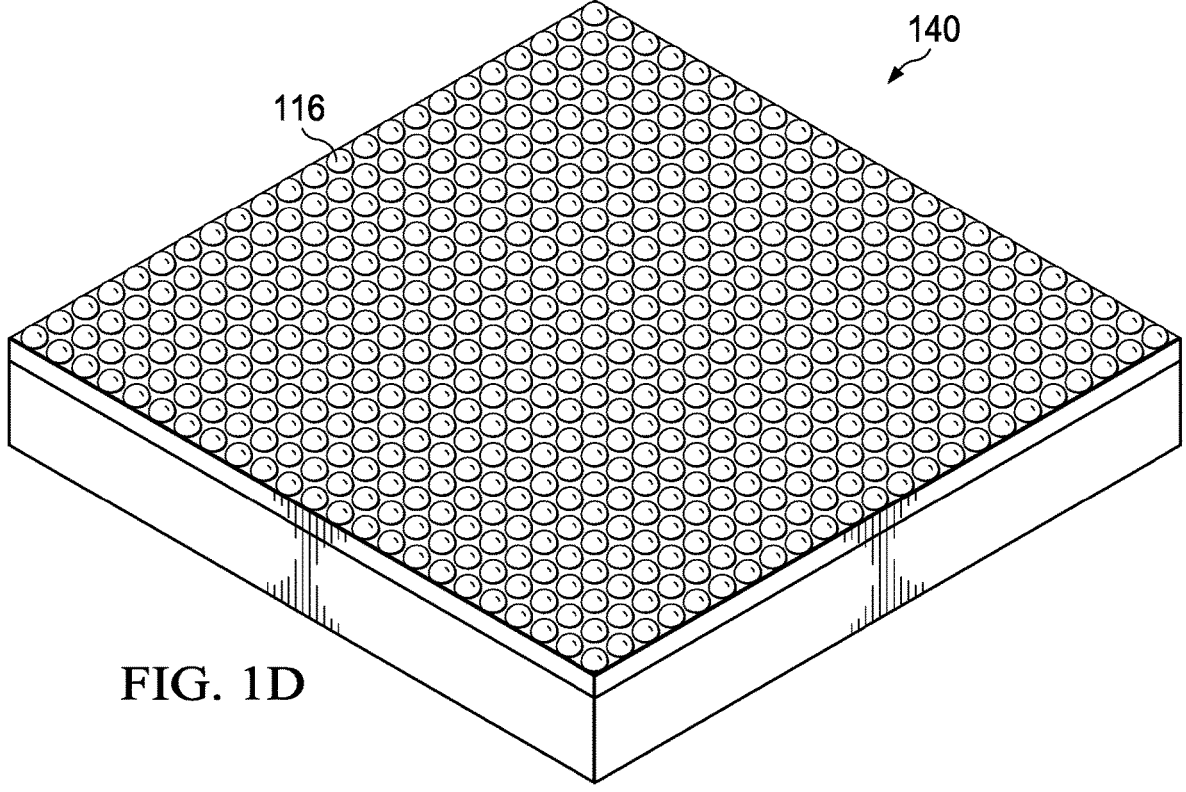

FIG. 1D illustrates, in a bottom side projection view, an example BGA package 140 similar to BGA packaged semiconductor device 130 shown in FIG. 1C, with the BGA solder ball terminals 116 shown. The solder ball terminals can be arranged in a complete or partial grid pattern, and can be of various sizes depending on the package and the current requirements of the packaged semiconductor device 140. Some of the terminals 116 can carry ground potential, and some can carry power potential to the semiconductor device in the package 140.

Figure 2A:
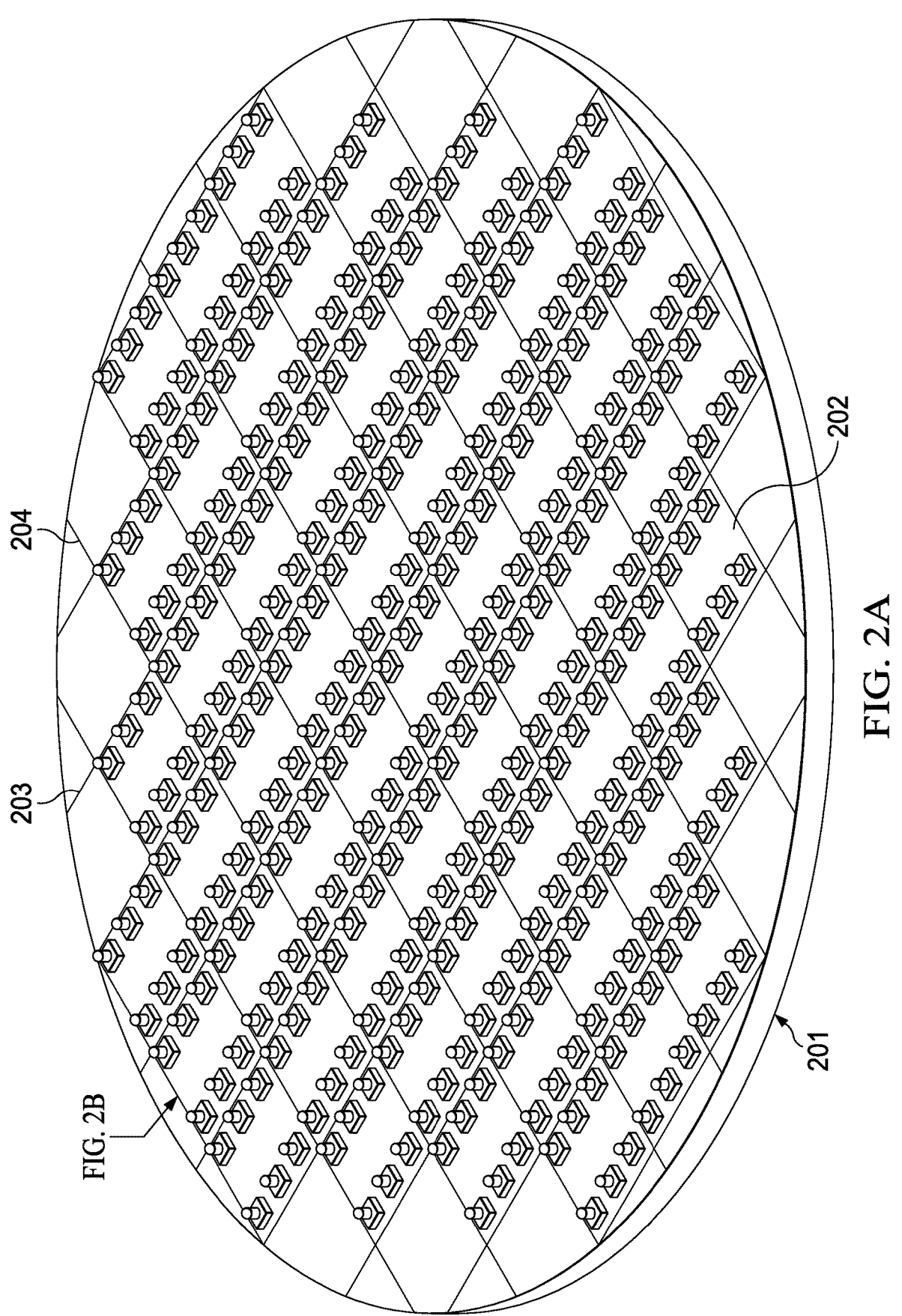
FIGS. 2A-2B illustrate, in a projection view and a close up projection view, respectively, semiconductor dies on a semiconductor wafer and an individual semiconductor die from the semiconductor wafer.
Figure 2B:
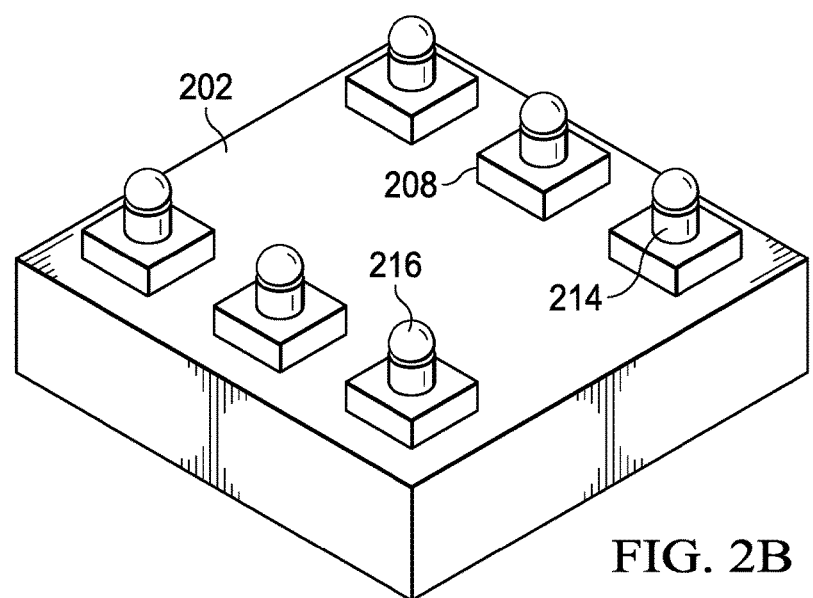

FIGS. 2A-2B illustrate, in a projection view and a close up view, semiconductor device dies 202 arranged on a semiconductor wafer 201 for use in the arrangements. In FIG. 2A, a semiconductor wafer 201 is shown with an array of semiconductor dies 202 in rows and columns formed on a device side surface of the semiconductor wafer 201. The semiconductor device dies 202 are formed using processes in a semiconductor manufacturing facility, including ion implant doping, anneal, oxidation, dielectric and metal deposition, photolithography, pattern, etch, chemical mechanical polishing (CMP), electroplating, and other processes for making semiconductor devices. Perpendicular scribe lanes 203 and 204 run in parallel groups across the wafer, and separate the rows and columns of the completed semiconductor dies 202, the scribe lanes 203, 204 provide areas on the wafer for dicing to separate the semiconductor dies 202 from one another. Laser dicing or mechanical sawing can be used to dice the semiconductor wafer 201.

FIG. 2B illustrates in a projection a single semiconductor die 202, with bond pads 208, which are conductive pads that are electrically coupled to devices formed in the semiconductor device die 202. Conductive post connects 214 are shown extending away from a proximate end mounted on the bond pads 208 on the surface of semiconductor die 202, and solder bumps 216 are formed on the distal ends of the conductive post connects 214. The conductive post connects 214 can be formed by electroless plating or by electroplating. In an example, the conductive post connects 214 are copper pillar bumps. In one example process, copper pillar bumps can be formed by sputtering a seed layer over the surface of the semiconductor wafer 201, forming a photoresist layer over the seed layer, using photolithography to expose the bond pads 208 in openings in the layer of photoresist, plating the copper conducive post connects 214 on the bond pads, and them plating a lead solder or a lead-free solder such as an tin, silver (SnAg) or tin, silver, copper (SnAgCu) ("SAC") solder to form solder bumps 216 on the copper conductive post connects 214. In an alternative approach, the solder bumps 216 can be formed using a solder ball drop process followed by a thermal reflow to melt and shape the solder. Other conductive materials can be used for the conductive post connects in an electroplating or electroless plating operation, including silver, nickel, palladium, or tin, for example. Not shown for clarity of illustration are under bump metallization (UBM) which can be formed over the bond pads 208 prior to the pillar formation to improve plating and adhesion between the conductive post connects 214 and the bond pads 208. After the plating operations, the photoresist is then stripped, and the excess seed layer is etched from the surface of the wafer 201. The semiconductor dies 202 are then separated from the semiconductor wafer 201 by dicing, or are singulated, using the scribe lanes 203, 204 (see FIG. 2A).

Figure 3:
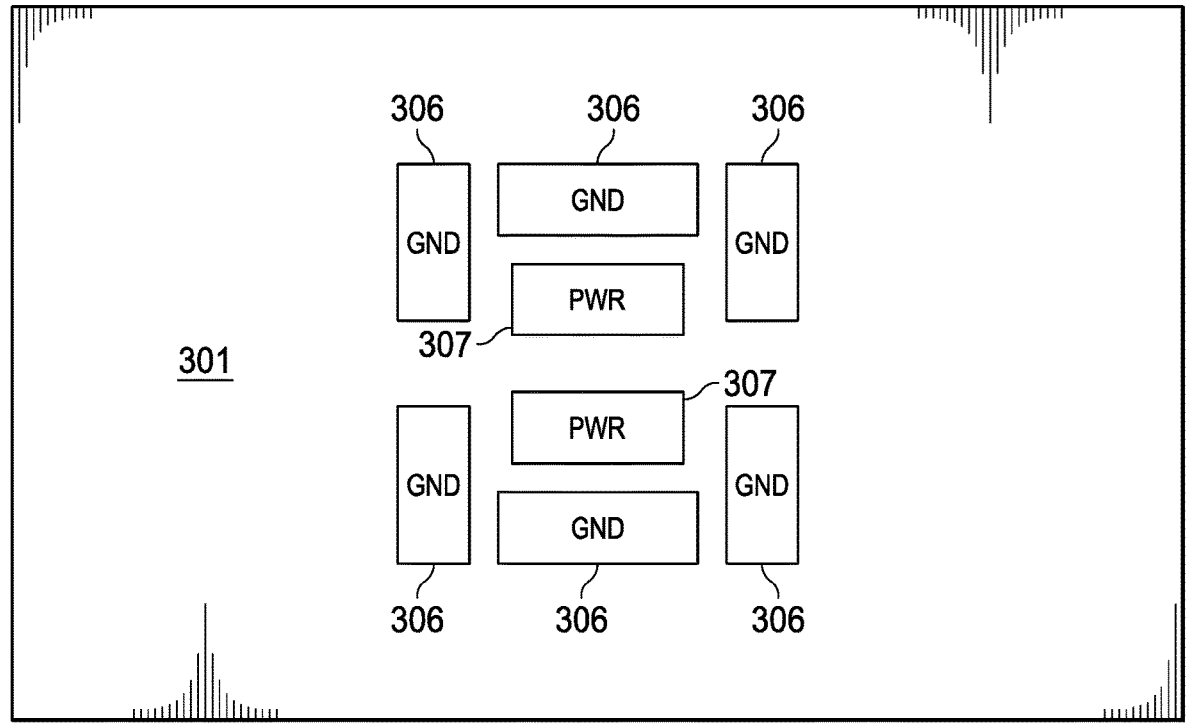
FIG. 3 illustrates in a plan view a portion of a printed circuit board including ground pads and power pads for mounting a packaged semiconductor device.

FIG. 3 illustrates, in a plan view, conductive lands positioned on a printed circuit board 301 for use with an arrangement. In FIG. 3, the conductive lands 306 labeled "GND" are arranged to couple a ground potential to a packaged semiconductor device. The conductive lands 305 labeled "PWR" are arranged to couple a voltage potential, such as VDD, to the terminals of a packaged semiconductor device. When mounting a packaged semiconductor device (not shown) to the printed circuit board 301, pads or terminals of the packaged semiconductor device are arranged to make contact with and be mounted to the conductive lands 305, 306 and to couple the ground and power potentials from the printed circuit board to the packaged semiconductor device. The position and arrangement of the terminals for the packaged semiconductor device is coordinated with the corresponding conductive lands 305, 307 on the printed circuit board 301. The packaged semiconductor device will have power and ground terminals that are positioned to mount to the conductive lands 305, 306.

Figure 4A:
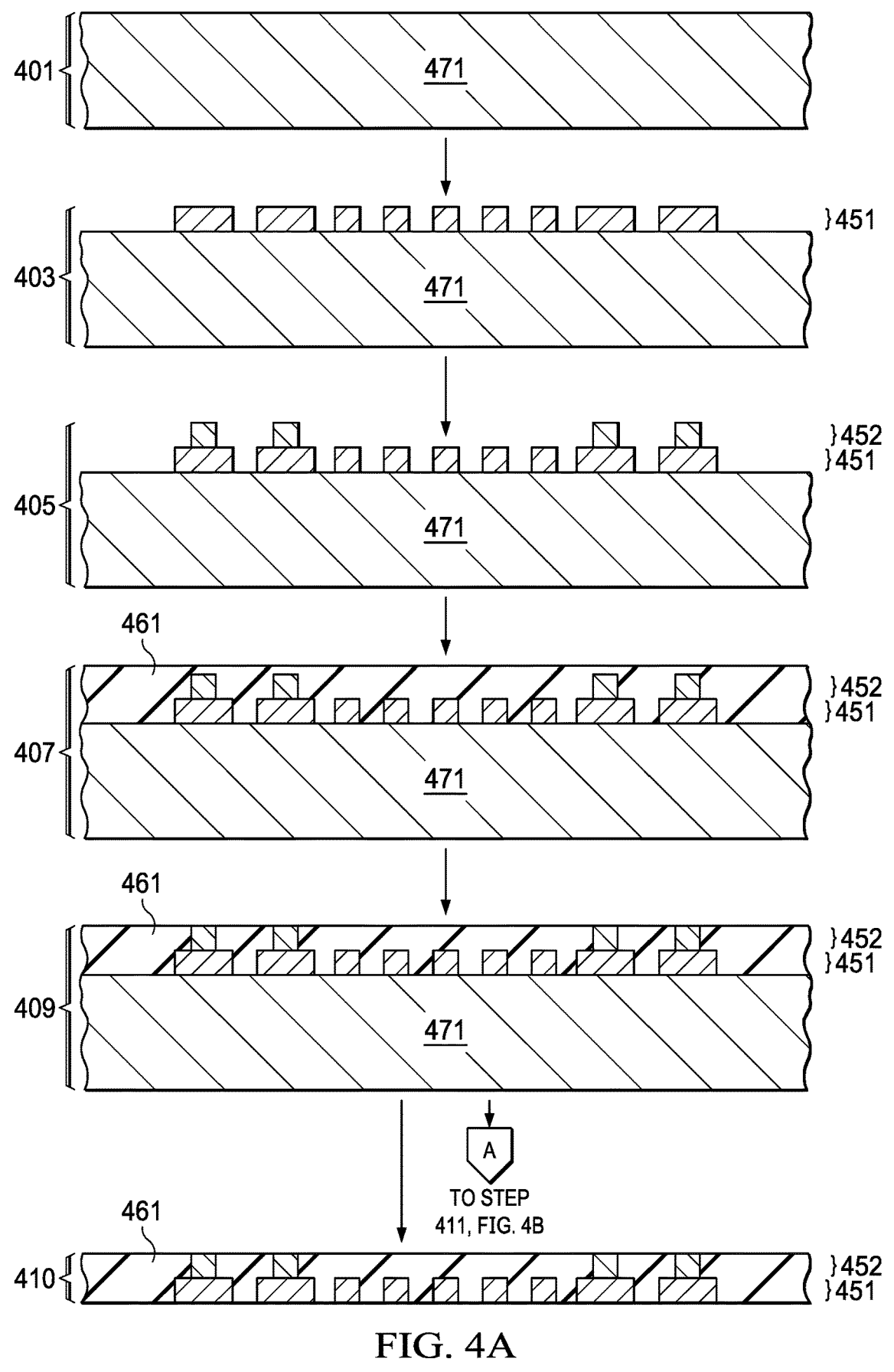
Figure 4B:
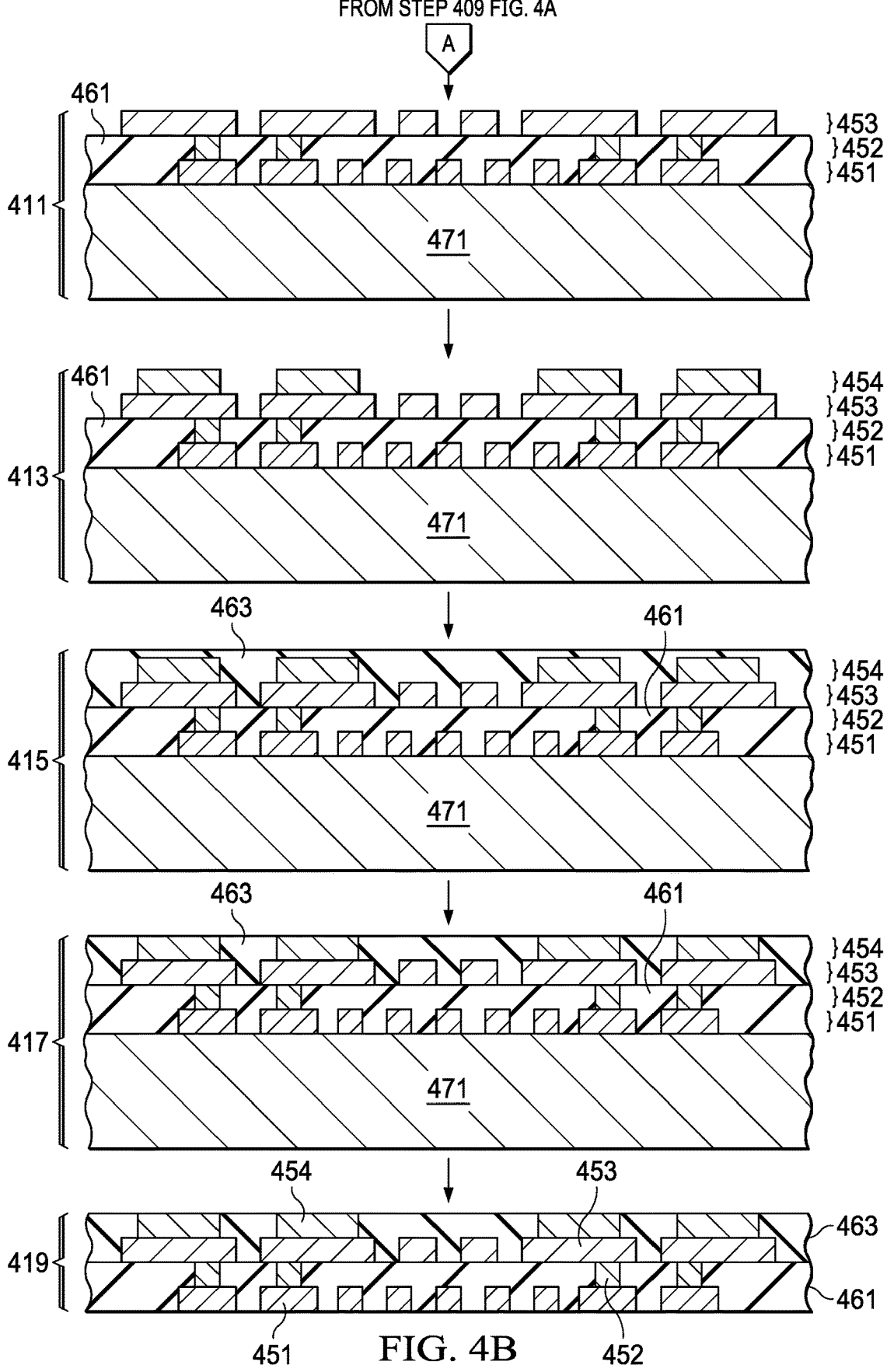

FIGS. 4A-4B illustrate, in a series of cross sectional views, selected steps for a method for forming a multilayer package substrate that is useful with the arrangements. In FIG. 4A, at step 401, a carrier 471 is readied for a plating process. The carrier 471 can be silicon, glass, stainless steel, steel, aluminum or another carrier that will support the multilayer package substrate layers during plating and molding steps. In an example process, after the multilayer package substrate is completed, the carrier 471 is removed, and the carrier 471 can be cleaned for use in additional manufacturing processes.

At step 403, a first trace layer 451 is formed on carrier 471 by plating. In an example process that forms first trace layer 451 on the carrier 471, a seed layer is deposited over the surface of the carrier 471, by sputtering, chemical vapor deposition (CVD) or other deposition step. A photoresist layer is deposited over the seed layer, exposed, developed and cured to form a pattern to be plated. Electroless plating or electroplating is performed using the exposed portions of the seed layer to start the plating, forming a pattern according to patterns in the photoresist layer.

At step 405, then plating process continues. A second photoresist layer is deposited, exposed, and developed to pattern the first vertical connection layer 452. By leaving the first photoresist layer in place, the second photoresist layer is used without an intervening strip and clean step, to simplify the process. The first trace layer 451 can be used as a seed layer for the second plating operation, to further simplify processing.

At step 407, a first molding operation is performed. The first trace layer 451 and the first vertical connection layer 452 are covered in a dielectric material. In an example a thermoplastic material is used, in a particular example acrylonitrile butadiene styrene (ABS) is used; in alternative examples acrylic styrene acrylonitrile (ASA) can be used, a liquid crystal polymer or thermoset epoxy resin mold compound can be used, or resins, epoxies, or plastics can be used. In an example compressive molding operation, a mold compound can be heated to a liquid state, forced under pressure through runners into a mold to cover the first trace layer 451 and the first vertical connection layer 452, and subsequently cured to form solid mold compound as the dielectric 461.

At step 409, a grinding operation performed on the surface of dielectric 461 exposes a surface of the vertical connection layer 452 and provides conductive surfaces for mounting devices, or for use in additional plating operations. If the multilayer package substrate is complete, the method ends at step 410, where a de-carrier operation removes the carrier 471 from the dielectric material 461, leaving the first trace layer 451 and the first vertical connection layer 452 in a dielectric material 461, providing a package substrate.

In examples where additional trace layers and additional vertical connection layers are needed, the method continues, leaving step 409 and transitioning to step 411 in FIG. 4B.

At step 411, a second trace layer 453 is formed by plating using the same processes as described above with respect to step 405. A seed layer for the plating operation is deposited and a photoresist layer is deposited and patterned, and the plating operation forms the second trace layer 453 over the dielectric 461, with portions of the second trace layer 453 electrically connected to the first vertical connection layer 452.

At step 413, a second vertical connection layer 454 is formed using an additional plating step on the second trace layer 453. The second vertical connection layer 454 can be plated using the second trace layer 453 as a seed layer, and without the need for removing the preceding photoresist layer, simplifying the process.

At step 415, a second molding operation is performed to cover the second trace layer 453 and the second vertical connection layer 454 in a layer of dielectric material 463.

The multilayer package substrate at this stage has a first trace layer 451, a first vertical connection layer 452, a second trace layer 453, and a second vertical connection layer 454, portions of the layers are electrically connected together to form vertical paths through the dielectric layers 461 and 463.

At step 417, the dielectric layer 463 is mechanically ground in a grinding process or chemically etched to expose a surface of the second vertical connection layer 454. At step 419 the example method ends by removing the carrier 471, leaving a multilayer package substrate including the conductor layers 451, 452, 453 and 454 in dielectric layers 461, 463. The steps of FIGS. 4A-4B can be repeated to form multilayer package substrates for use with the arrangements having more layers, by performing plating of a trace layer, plating of a vertical connection layer, molding, and grinding, repeatedly.

In the arrangements, a multilayer package substrate is used that is formed using the process of FIGS. 4A-4B. The multilayer package substrate of the arrangements is formed using additive manufacturing techniques, or a "build up" process as shown in FIGS. 4A-4B. An advantage of the multilayer substrates made in this manner is that the vertical connection layers can take any shape and can include walls or rails, and can form arbitrary shapes.

The build-up process for the multilayer package substrate is in contrast to the laminate via systems used for multilayer PCBs, for example, where the vertical connections between horizontal trace layers are formed as vias between horizontal layers, and then become filled vias. In making the filled vias of the laminate PCBs, holes are drilled through dielectric material, the holes are plated, and the plated holes are filled with conductor material. These vias are of limited flexibility in terms of shape and size, and the resulting routing designs that are available are limited.

In contrast to PCBs and ceramic substrates, the multilayer package substrates used in the arrangements have vertical conductive connection layers between the horizontal conductor layers that are built up, instead of drilled, and which can be of any shape or size. The multilayer package substrates provide a highly flexible routing system where conductor patterns such as mesh, grid, and comb patterns can be formed. The conductor patterns on any layer can be repeated through the layers of the structure, forming low resistance stacks of highly uniform conductive paths. Alternatively, highly flexible routing distribution layers can be formed from a top surface to a bottom surface of the multilayer package substrate to route connections as the conductive paths traverse the layers of the multilayer package substrate.

Figure 5A:
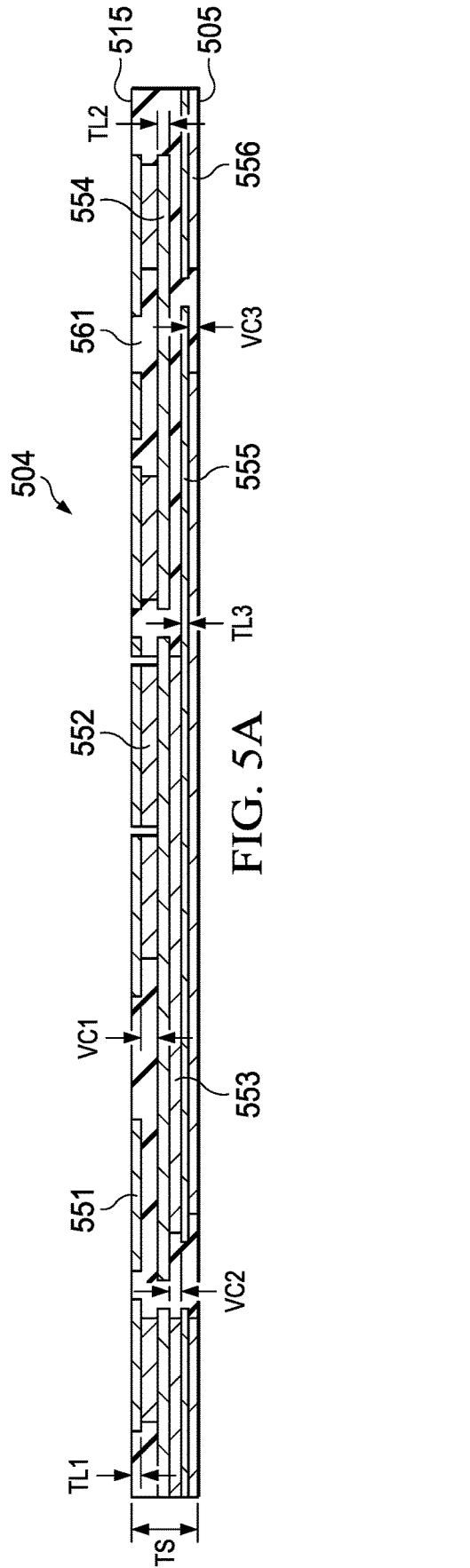
FIG. 5A illustrates, in a cross sectional view, a multilayer package substrate for use with the arrangements.

FIG. 5A illustrates in a cross sectional view an example multilayer package substrate 504 for use with an arrangement. In an example arrangement, the multilayer package substrate 504 is a multilayer package substrate with a substrate thickness labeled "TS" of about 200 microns. The first horizontal trace layer, 551, at the device side surface 515 of the multilayer package substrate 504, has a thickness TL1 of about 15 microns. The first vertical connection layer, 552, has a thickness VC1 of about 25 microns. The horizontal second trace layer, 553 has a thickness labeled TL2 of about 60 microns. In some places the first horizontal trace layer 551 is shown coupled to the second horizontal trace layer 553 by the first vertical connection layer 552. The second vertical connection layer, 554, has a thickness labeled VC2 of about 65 microns. The third horizontal trace layer, 555, has a thickness labeled TL3 of about 15 microns, and the third vertical connection layer, 556, has a thickness labeled VC3 of about 25 microns. Additional layers, such as conductive lands on the device side surface 515, or terminals on the board side surface 505, may be formed by plating (not shown in FIG. 5A). A continuous electrical connection between the device side surface 515 and the board side surface 505 can be formed by patterning horizontal trace layers and the corresponding vertical connection layers to form a continuous conductive path extending through the dielectric material 561. The dielectric material 561 can be a thermoset mold compound, a liquid crystal polymer (LCP), or a thermoplastic material such as ABS or ASA.

In the arrangements, power and ground connections between the external terminals of the packaged semiconductor device and the post connects of a flip chip mounted semiconductor device are routed through a multilayer package substrate. In the example arrangements, post connect lands for ground and power connections between a semiconductor device and the device side surface of a multilayer package substrate are intermixed, so that the post connects arranged to carry a power potential and the post connects arranged to carry a ground potential can be placed adjacent or in proximity to one another. The post connect lands are formed at the device side surface of the multilayer package substrate in various patterns. The routing distribution within the multilayer package substrate can then be used to route the ground and power connections to package terminals or pads on a board side surface of the multilayer package substrate, to provide compatibility with the power and ground lands on a printed circuit board.

Figure 5B:
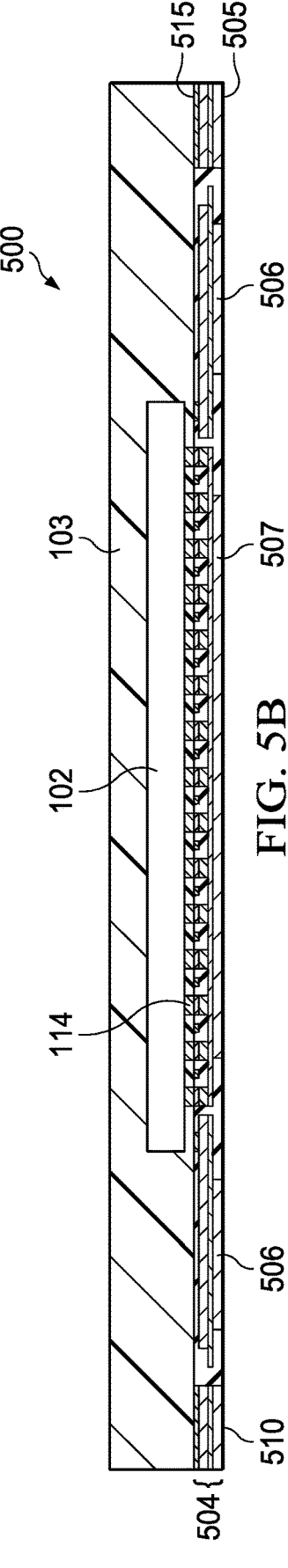
FIG. 5B illustrates in a further cross sectional view, a semiconductor device package of an arrangement using a multilayer package substrate.

FIG. 5B illustrates in a cross sectional view an example arrangement with a multilayer package substrate in a QFN package. QFN semiconductor device package 500 includes a multilayer package substrate 504. A semiconductor device 102 is shown flip chip mounted to the device side surface 515 of the multilayer package substrate 504. Post connects 114 extend from the semiconductor device 102 to solder joints (not visible) made on the multilayer package substrate 504, and can be connected to conductive traces in a first trace layer on multilayer package substrate 504. Mold compound 103 is formed over the device side surface 515 of the multiplayer package substrate 504 and covers semiconductor device 102. A board side surface 505 of the multilayer package substrate 504 has terminals 510 for carrying signals to a printed circuit board (not shown) from the semiconductor device 102. Ground pads 506 and power pads 507 are formed on the board side surface 505 of the multilayer package substrate 504. The ground pads 506 and power pads 507 on the board side surface 505 of the multilayer package substrate 504 correspond to and are positioned to be mounted to the ground lands and power lands (see 306, and 307, of FIG. 3) on a printed circuit board. Ground pad terminals and power pad terminals 506, 507 are arranged so that the packaged semiconductor device 500 can be surface mounted to the printed circuit board.

A mapping or redistribution is performed to connect the ground and power post connects (114 in FIG. 5B) to the ground pads (506) and power pads (507) on the board side surface of the packaged semiconductor device. This mapping is accomplished using the horizontal trace layers and vertical connection layers in the multilayer package substrate 504.

Figure 6A:
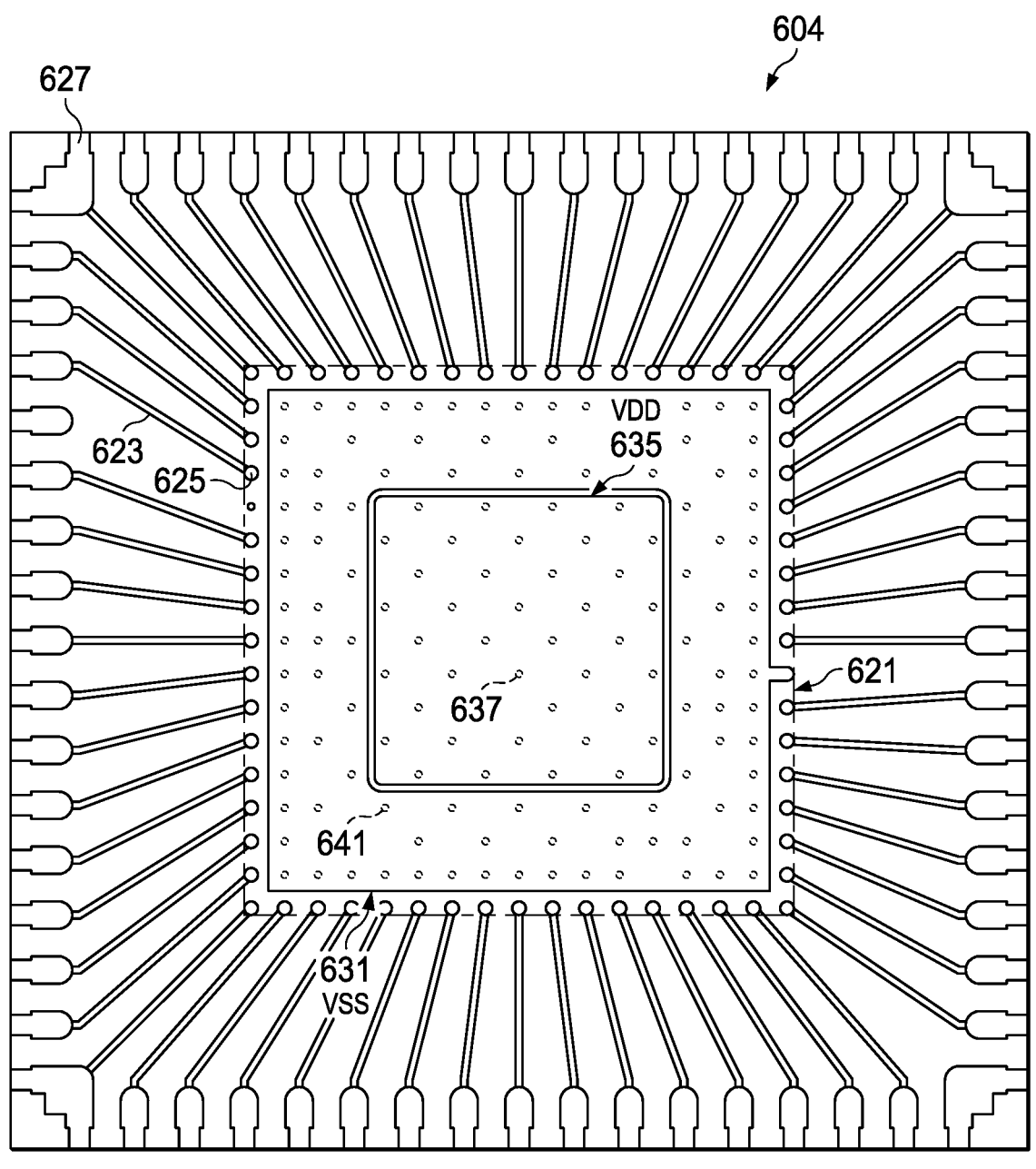
FIGS. 6A-6B illustrate, in plan views, a device side layer and a board side layer of a multilayer package substrate for use in a semiconductor device package.

FIG. 6A illustrates an example multilayer package substrate 604 in a plan view looking at the device side surface. In FIG. 6A features in a first trace layer of the multilayer package substrate are 604 are visible. A die mount area 621 is shown in a dashed line indicating where a semiconductor device die (not shown) will be flip chip mounted. Post connects (not shown) that extend from bond pads on the semiconductor device will meet conductive lands on the device side surface of the multilayer package substrate 604. Signal traces 623 extend from signal lands 625 in the die mount area 621 to signal pads 627 on the periphery of the multilayer package substrate 604, these signal pads 627 will be contacted with conductor material vertically through the dielectric layers of the multilayer package substrate 604 to a board side surface to form terminals for a packaged semiconductor device. Traces 623 are formed of copper, tungsten, gold, aluminum or alloys of these. The rectangular border 631 corresponds to a ground plane for receiving post connects for carrying a ground potential. When a semiconductor device is flip chip mounted to the multilayer package substrate 604, the post connects that extend from the semiconductor device will contact this conductive pattern and be arranged to be coupled to a ground potential. Ground post connect positions 635 are shown in the ground plane 631 that correspond to the positions of ground post connects on the semiconductor device. The center rectangular conductive pattern 641, which can be a square or rectangle, or take other pattern shapes such as multiple rectangular areas, includes power post connect positions 637 that will be contacted by post connects on the semiconductor device and that are arranged to be coupled to a power potential such as a supply voltage, sometimes referred to as VDD. By using multiple post connects to carry ground potentials and to carry power potentials to a flip chip mounted semiconductor device, low resistance parallel paths are created to power devices within the semiconductor device, such as power FETs. These parallel paths also can provide the capability of carrying high current and high voltages to a power FET within the semiconductor device.

Figures 6B, 6C:
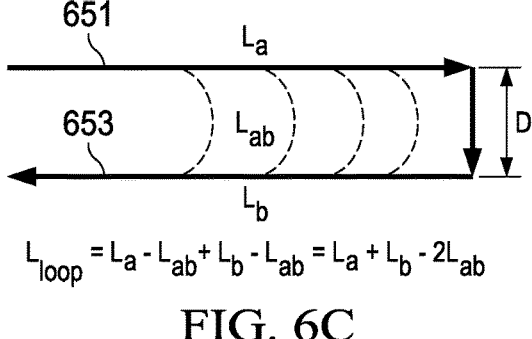
FIG. 6C illustrates, in a block diagram, a loop inductance calculated for two conductors spaced apart.

FIG. 6B illustrates the multilayer package substrate 604 in a plan view looking from a board side surface that is opposite the device side surface view of FIG. 6A. Terminals 610 are shown on the periphery, these are arranged for carrying signals to the semiconductor device. Ground pads 606 (labeled "VSS") are shown in this example as four rectangles arranged on four sides of board side surface of the multilayer substrate. A central power pad 607 labeled VDD is shown in the center of the bottom surface of the multilayer package substrate. Each of these pads 606, 607 will be used to make an electrical connection to a corresponding land on a printed circuit board when the packaged semiconductor device is mounted.

In the approach as shown in FIGS. 6A-6B, a multilayer package substrate 604 can have ground and power connection patterns arranged to keep the ground and power connections spaced apart, and which end in the ground and power pads 605, 607 on the board side surface shown in FIG. 6B. In one approach the bottom level pattern of pads 606, 607 could be repeated at each level through the dielectric layers of the multilayer package substrate 604, to couple the ground and power pads from the pads on the board side surface to the post connect lands on the device side surface. These lands will correspond to the positions of the post connects of the flip chip semiconductor device that is to be mounted on the device side surface.

However, an important performance characteristic of the packaged semiconductor device is the loop inductance between the ground and power conductors. In example arrangements, and in contrast to the approach shown in FIGS. 6A-6B, the post connects carrying ground and power are intermixed among each other at the device side surface of a multilayer package substrate, and the connections are routed using the conductors in the multilayer package substrate to reduce the loop inductance in the packaged semiconductor device.

FIG. 6C illustrates in a block diagram the loop inductance $L_{loop}$ between two conductors 651, 653 spaced by distance "D". The loop inductance is determined by self-inductance La and Lb and a mutual inductance Lab. The loop inductance is the sum of the self-inductance La, Lb for the two conductors 651, 653, minus twice the mutual inductance Lab between the two conductors. The loop inductance is described by Equation 1:

$$L_{loop}=L_a-L_{ab}+L_b-L_{ab}=L_a+L_b-2L_{ab}. \qquad \text{(Equation 1)}$$

As can be seen in FIG. 6C, the loop inductance $L_{loop}$ between the two conductors 651, 653 increases as the spacing distance D between the two conductors increases, and decreases as the spacing distance D between the two conductors decreases, because the mutual inductance $L_{ab}$ increases as the two conductors are placed closer together. In example arrangements, the power routing and ground routing connections through the multilayer package substrate are configured to increase the mutual inductance, and the loop inductance $L_{loop}$ is therefore reduced. In the example arrangements, this is accomplished by intermixing the post connect locations on the die side surface of the multilayer package substrate, so that a post connect configured to carry a ground potential is placed proximate to a post connect configured to carry a power potential.

The power and ground routing in the example of FIGS. 6A and 6B places the power and ground conductors together and spaced apart from one another. However, in the example arrangements, the power post connect and ground post connect positions on the device side surface of a multilayer package substrate are intermixed to keep the spacing between post connects carrying the two voltage potentials relatively small, increasing the mutual inductance. In useful examples, the distance between adjacent post connects is between 5 microns and 100 microns, and less than 100 microns. In another example, a plurality of the power post connect positions are within two post connect positions of a ground post connect position. Use of the arrangements results in reduced loop inductance between the power and ground conductors. In the arrangements the power and ground terminals or pads on the board side of the multilayer package substrate are formed so that the packaged semiconductor device configuration can be the same as for prior packaged devices. This aspect of the arrangements allows printed circuit boards or system boards already designed to be used with the packaged semiconductor devices of the arrangements. In additional alternative arrangements where this characteristic is not necessary, the power and ground terminal shapes and positions can be further varied on the package substrate.

Figure 7A:
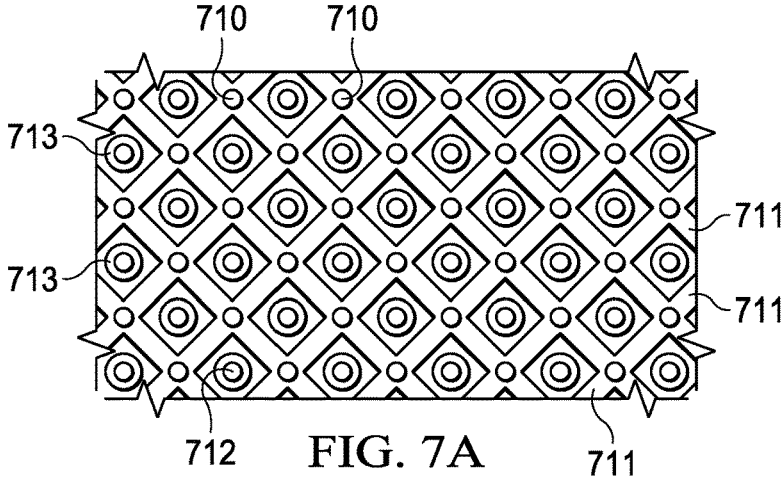
FIG. 7A illustrates, in a block diagram, a mesh arrangement for a layer of a multilayer package substrate including power post connect locations for carrying power, and ground post connect positions for carrying ground.

FIG. 7A illustrates, in a plan view, an example mesh arrangement for conductors and post connect positions for power and ground connections. In FIG. 7A, a mesh pattern is shown for a conductor layer 711 coupling post connect locations 710 on a trace layer of a multilayer package substrate. Post connect locations 712 illustrate where ground post connects can contact a ground plane 713 in spaces between the mesh conductors 711 for the power post connects. The mesh pattern of conductors 711 can be formed in one of the conductor layers of the multilayer package substrate so that the post connects for a power potential, such as VDD, can contact the mesh conductors directly or through vertical connections in the multilayer package substrate. The ground post connect positions 713 include positions in openings in the mesh, these can contact a ground conductor on a layer of the multilayer package substrate that is over the mesh, or under the mesh, and which is electrically isolated from the mesh. By intermixing the post connect positions 712 for ground and 710 power, the ground and power potentials are placed close together, increasing the mutual inductance in the packaged device. As described with respect to FIG. 6C, increased mutual inductance between conductor paths will result in a reduced loop inductance.

Figure 7C:
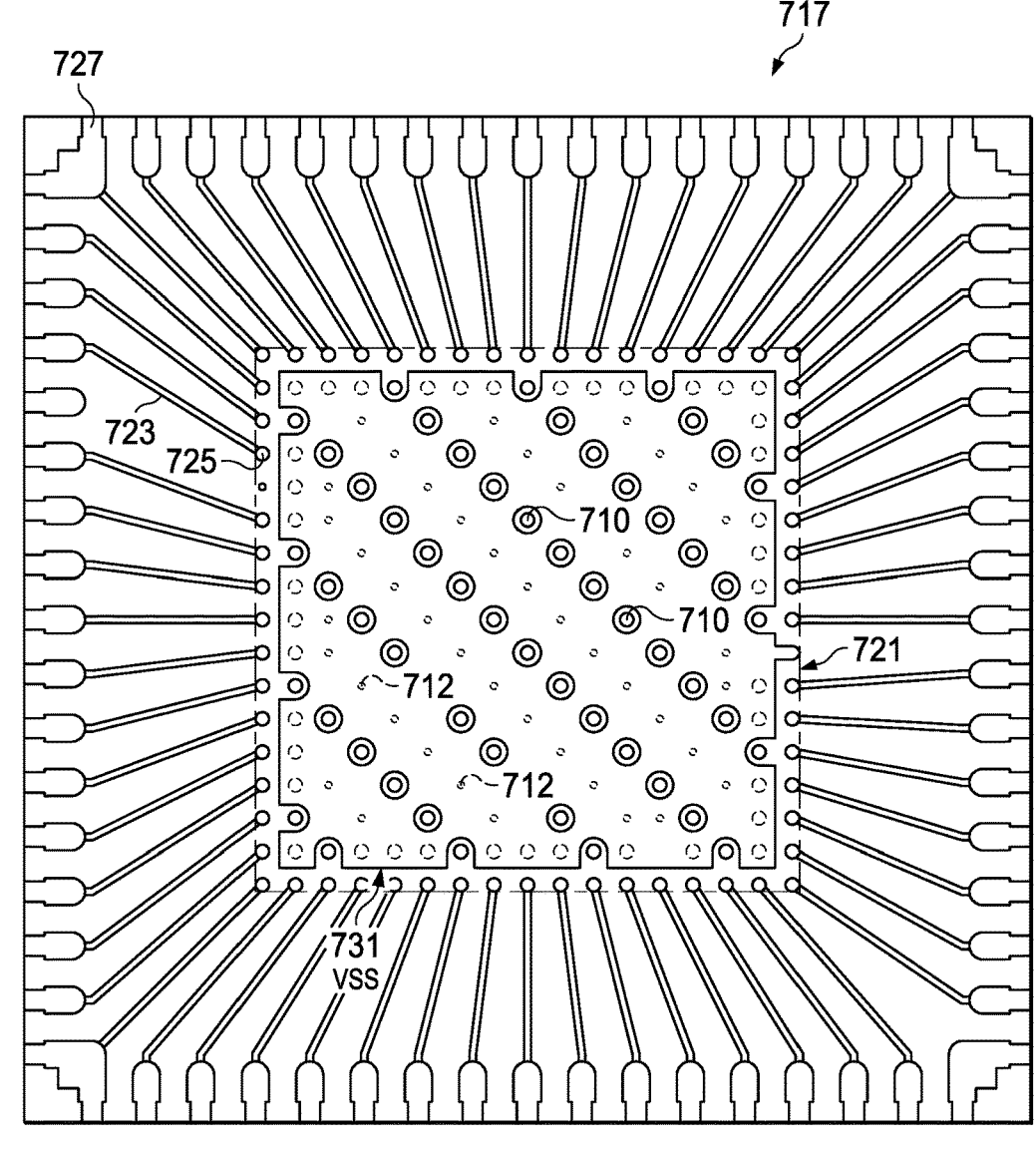
FIGS. 7C-7F illustrate, in plan views, conductor patterns for layers of a multilayer package substrate for use an arrangement.
Figure 7B:
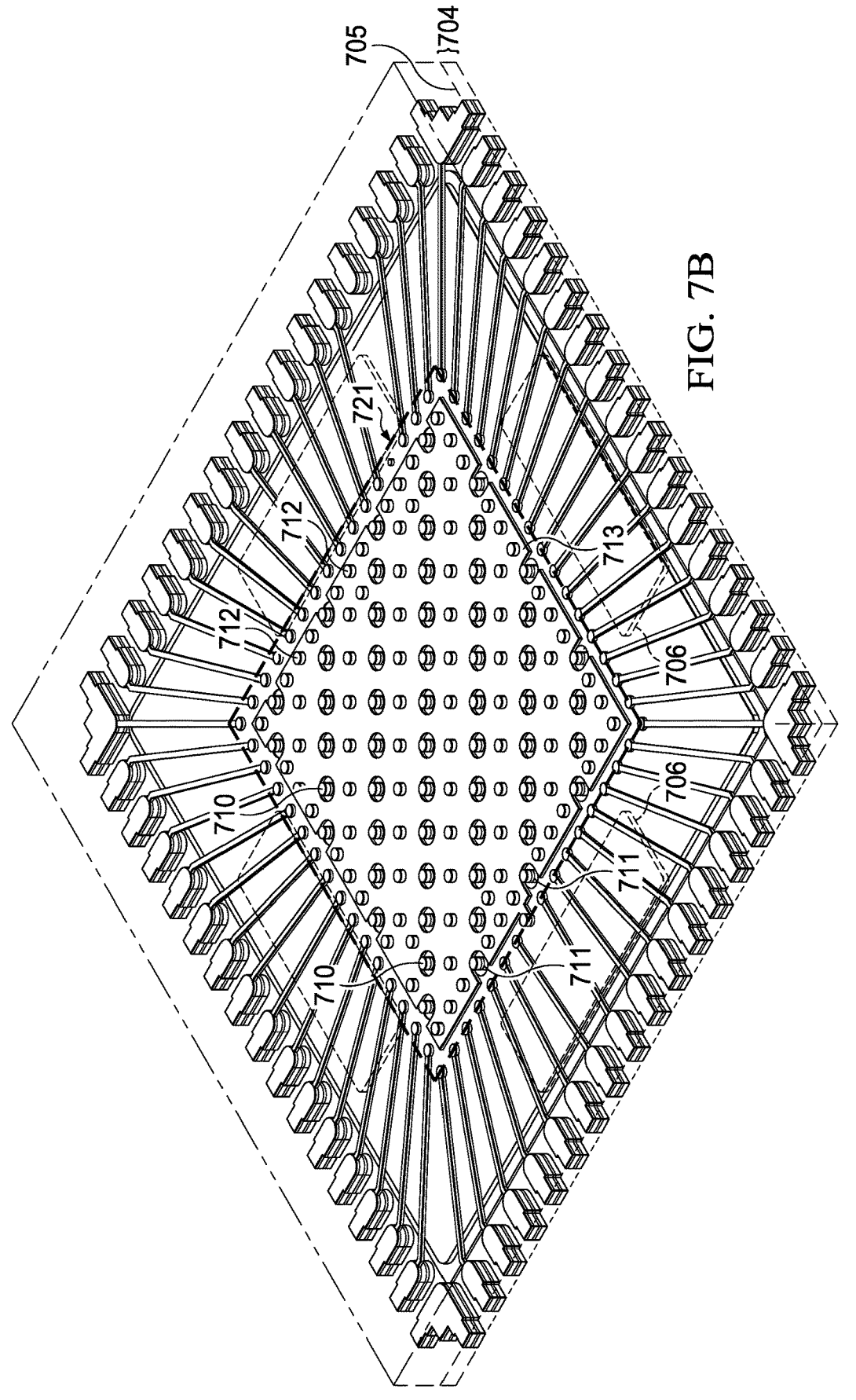
FIG. 7B illustrates, in a projection view, a multilayer package substrate for an arrangement.

FIG. 7B is a projection view of a portion of a multilayer package substrate 704 that includes the mesh routing of FIG. 7A implemented in an example arrangement. In FIG. 7B, the multilayer package substrate 704 is shown with power and ground routing and the corresponding post connect positions shown, however the semiconductor device die and the signal traces and signal routing are not shown in FIG. 7B, to further clarify the illustration.

In FIG. 7B, post connects 710 are shown on the die side surface 705 of a multilayer package substrate 704 with a die mount area 721. The post connects 710 will extend from a semiconductor device die (not shown) and be connected to conductors 711 by solder joints (not visible). The post connects 710 are arranged to carry a power potential such as a VDD voltage to the semiconductor device. Post connects 712 are shown contacting a conductor 713 which forms a rectangular layer. The post connects 712 are arranged to carry a ground potential, so that the rectangular conductor 713 forms a ground plane. The post connects 710 are coupled to vertical connections in openings formed in the ground plane conductor 713, so that the power post connects 710 are electrically isolated from the ground post connects 712 and the ground plane conductor 713, while the power post connects 710 are electrically connected to the power conductors 711, which are arranged in mesh pattern beneath the ground plane 713.

As shown in FIG. 7B, the ground post connects 712, which are arranged to carry a ground potential, and the power post connects 710 which carry a power potential, are intermixed in the die mount area 721. By intermixing the post connects carrying ground and power potentials, and placing the conductor traces carrying the ground and power potentials in close proximity to one another, the mutual inductance between ground and power in the package is increased, and the loop inductance is therefore decreased. In the example arrangement of FIG. 7B, for a plurality of the post connects 712, which carry the ground potential, a post connect 710, which carries the power potential, is within two post connect positions in the die mount area 721. This intermixing of the power and ground post connects and the corresponding conductor traces provides benefits of in reduced loop inductance gained by using the arrangements.

Also shown in FIG. 7B are the ground pads 706 which are visible on the board side surface of the multilayer package substrate 704, which are placed to correspond to ground lands on a printed circuit board. Power pads (not visible) will lie beneath the die mount area 721 and vertical connections formed within the layers of the multilayer package substrate will map the power potential from the post connects 710 to the power pads, as well as mapping the ground potential to the ground pads 706, as is further described below.

FIG. 7C illustrates, in a plan view from a die side surface, a first trace layer 717 of a multilayer package substrate (see 704 in FIG. 7B). Die mount area 721 indicates in a dashed line where a semiconductor device die (not shown) will be flip chip mounted to the multilayer package substrate on first trace layer 717. Post connect positions 725 indicate where signal post connects will contact the multilayer package substrate. Traces 723 couple the post connect positions 725 to signal pads 727 which will be coupled by conductors on the additional layers of the multilayer package substrate to pads on the board side surface, to form terminals for a packaged semiconductor device that will be used for coupling to lands on a printed circuit board.

In FIG. 7C, power post connect positions 710 are shown with conductor material 711 extending through openings in a ground plane 713, which is a rectangular layer of conductor material on the first trace layer 717 of the multilayer package substrate. Ground post connect positions 712 are shown on the ground plane 713. When a semiconductor device die is flip chip mounted to the multilayer package substrate on the first trace layer 717, the ground post connects will make contact and be coupled to the ground plane 713, which is a conductor formed in the first trace layer 717, and power post connects will contact conductor material 711 in openings in the ground plane 713 to a mesh conductor pattern, such as shown in FIG. 7A.

Figure 7D:
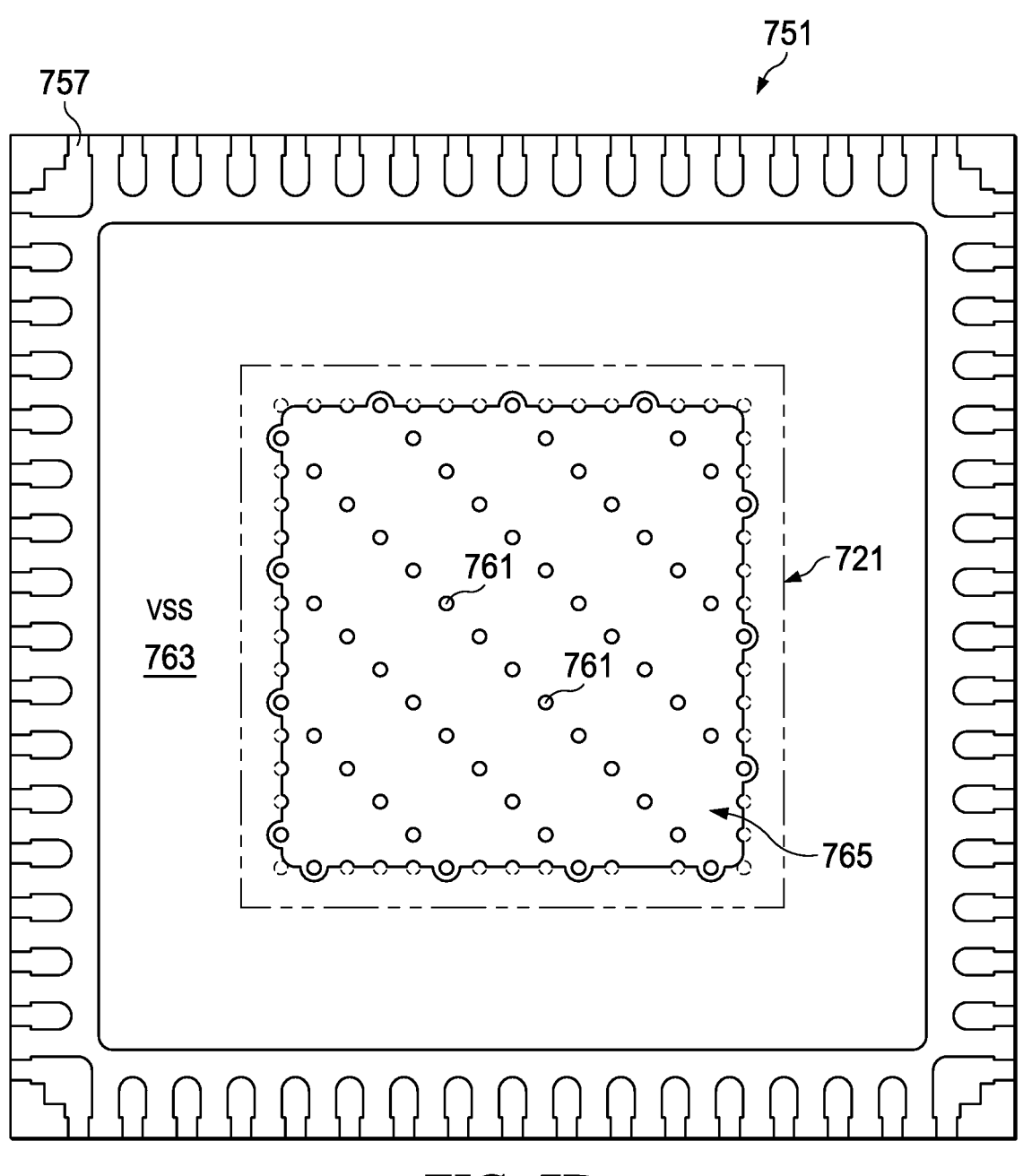

FIG. 7D illustrates, in another plan view, a first vertical connection layer 751 corresponding to the patterns of the first trace layer 717 shown in FIG. 7C. The first vertical connection layer 751 lies beneath the first trace layer 717 (see FIG. 7C). In FIG. 7D, the die mount area 721 is shown in a dashed line. Vertical power post connections 761 will couple to the mesh conductor pattern 711 from the first trace layer of FIG. 7C. The ground plane 713 from the first trace layer 717 is mapped onto a ground vertical connection layer 763 which translates the ground pattern to a peripheral pattern surrounding the die mount area 721. The signal connections at pads 727 in the first trace layer 711 are vertically connected through the first vertical connection layer 751 by pads 757.

Figure 7E:
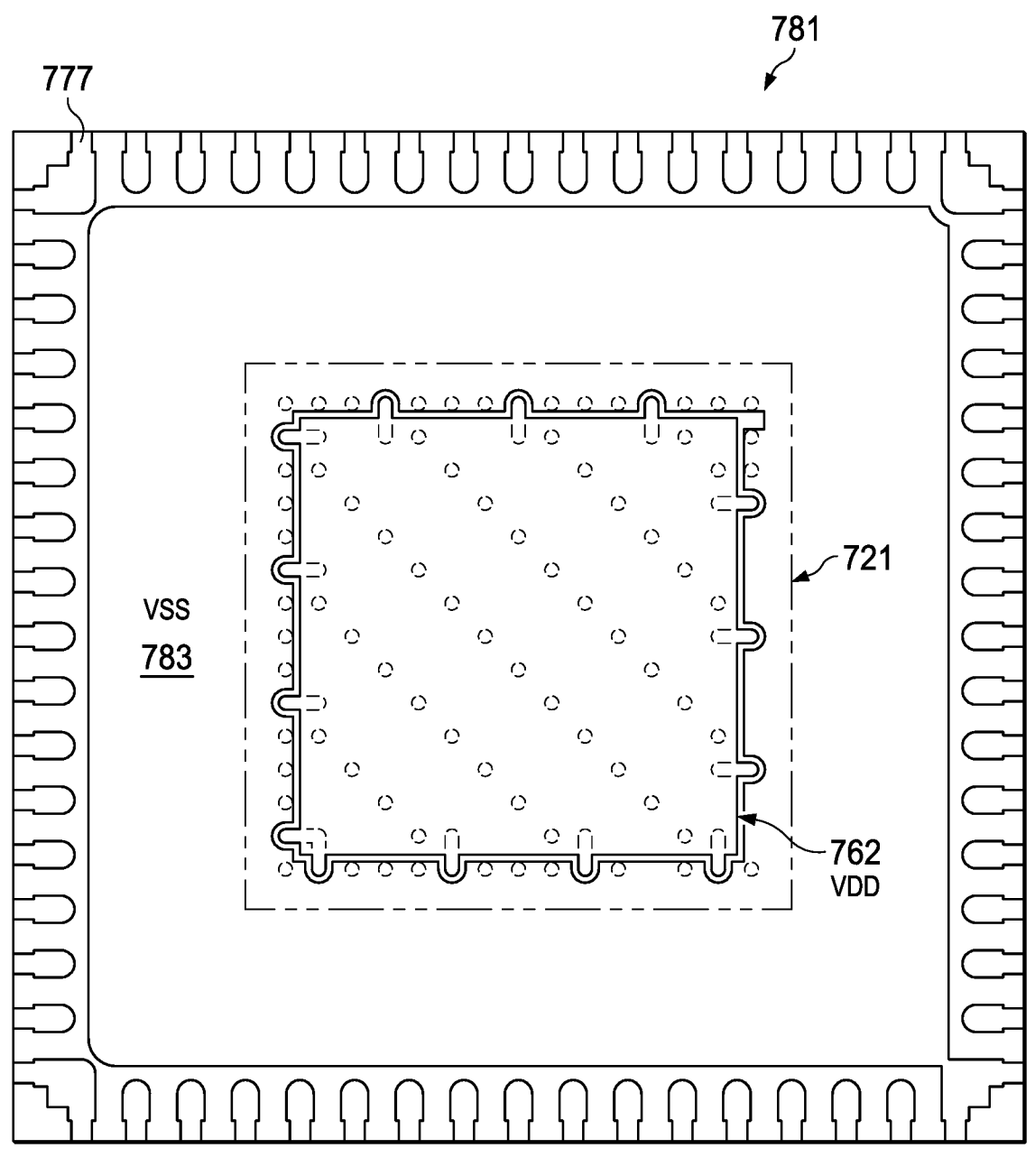

FIG. 7E illustrates in another plan view the second trace layer in a multilayer package substrate (see 704 in FIG. 7B). Die mount area 721 is again shown as a dashed line, with a power plane 762 in within the die mount area, and ground plane 783 in a peripheral pattern surrounding the power plane 762. The power and ground conductors are spaced apart in this second trace layer, and signal pad connections 777 extend the signal pad path through this layer. As can be seen from comparing the first trace layer of FIG. 7C, the first vertical connection layer in FIG. 7D, and the second trace layer of FIG. 7D, the ground connections are being mapped to a peripheral border surrounding the power connections, which are being mapped to a center power plane portion beneath the die mount area 721.

Figure 7F:
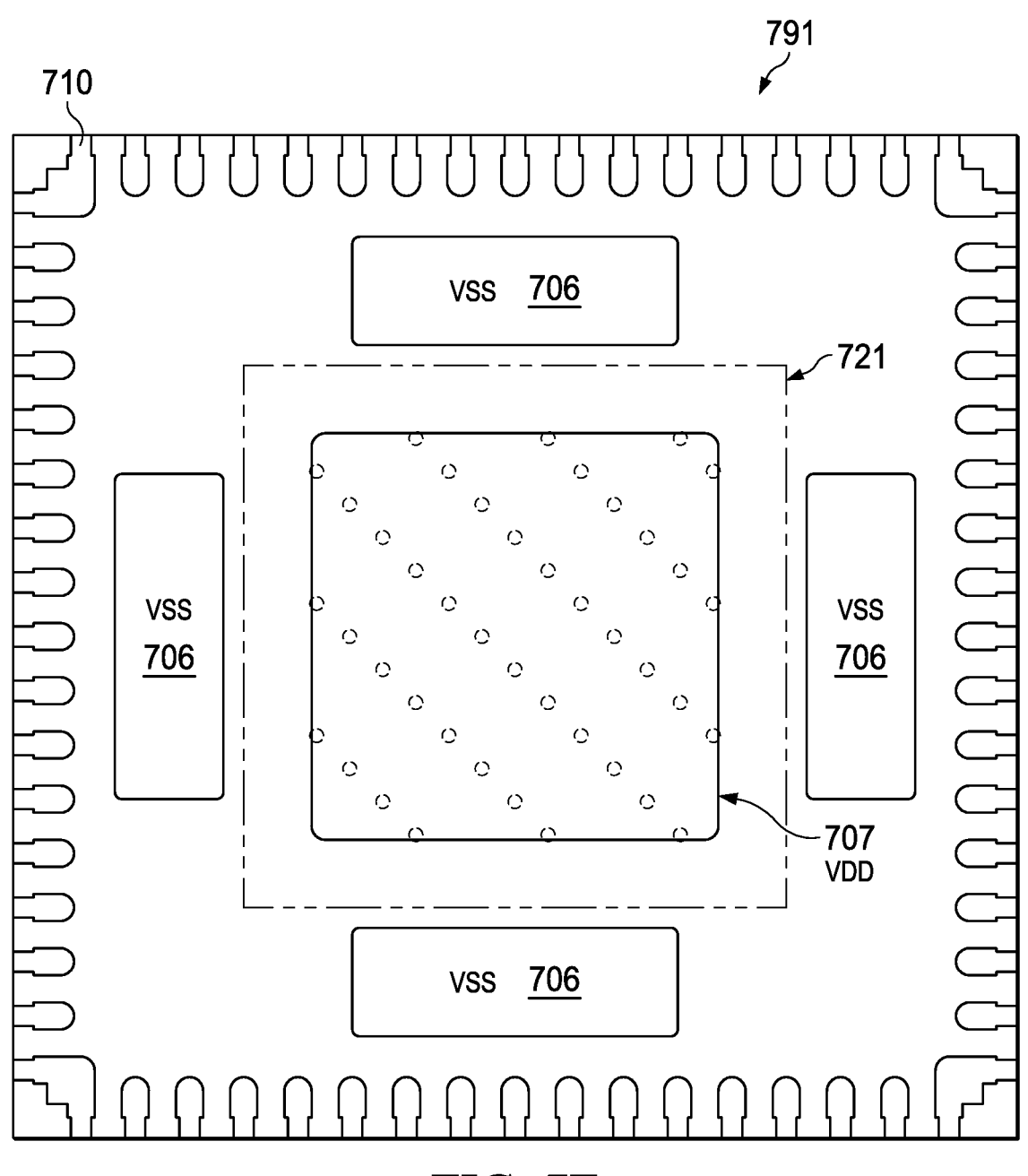

FIG. 7F is a plan view of the second vertical connection layer 791 which forms the board side surface of the multilayer package substrate (see 704 in FIG. 7B). The ground pads 706 are coupled to the ground plane 783 in FIG. 7E on the second trace layer, and the power pad 707 is coupled to the power plane 762 in the second trace layer 781. The terminals 710 are coupled to the semiconductor die through the second trace layer, the first vertical connection layer, the first trace layer and the traces 723 in FIG. 7C to couple the signals from the post connect locations on the first trace layer where the semiconductor die will be mounted to the package terminals.

The multilayer package substrate 704 shown in FIG. 7B, in conjunction with the layers shown in FIGS. 7C-7F, results in ground and power pads at the board side surface of the multilayer package substrate with the same pattern as shown in FIG. 6A. The use of the mesh pattern for the power post connects and the ground post connects does not change the power pad and ground pad arrangements for the packaged semiconductor device. This feature allows packaged semiconductor devices using the arrangements to be mounted to printed circuit boards using prior package patterns, so that no additional retooling or changes are needed to use the arrangements, and the use of the arrangements does not change the terminals of the packaged semiconductor device.

Figure 8A:
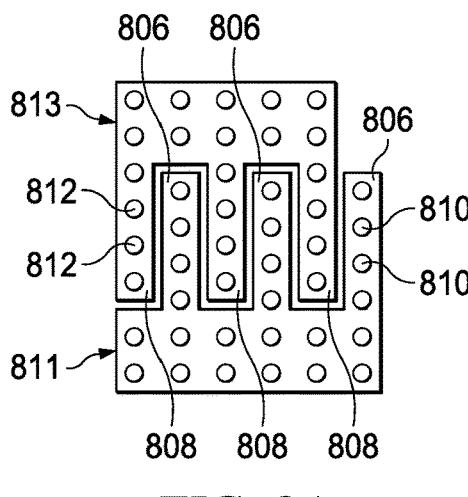
FIG. 8A illustrates, in a block diagram, a comb structure for conductors that carry power and ground, including power post connect positions and ground post connect positions for use in a multilayer package substrate.

FIG. 8A illustrates in a plan view an alternative arrangement that intermixes power post connect and ground post connects. In FIG. 8A a ground plane 813 has ground post connect locations 812 on first fingers 808 extending from a top side of the figure to the center. A power plane 811 is shown with post connects 810 arranged along second fingers 806 extending from a bottom side to the center with first fingers 808 and second fingers 806 interlaced to form a comb structure. The power post connect locations 810 and the ground post connect locations 812 are intermixed, so that for at least some of the ground post connect locations 812, a power post connect location 810 is adjacent to the ground post connect location or within three post connect locations. By arranging the post connect locations in the comb structure, the mutual inductance is increased, and as described above, the loop inductance between the ground and power conductors can be reduced.

Figure 8B:
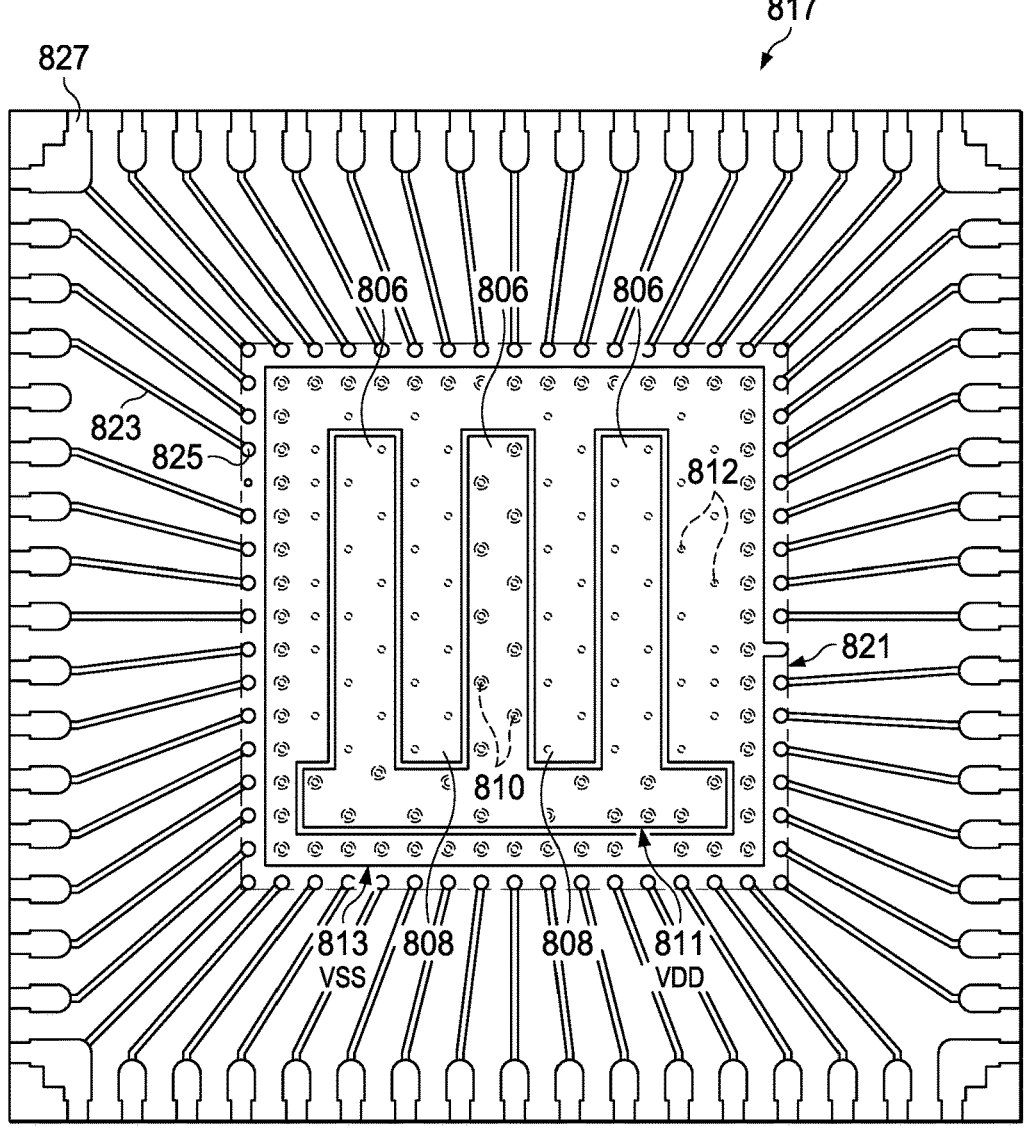
FIGS. 8B-8E illustrate, in plan views, layers of a multilayer package substrate of an arrangement.

FIG. 8B illustrates in a plan view a first trace layer 817 for a multilayer package substrate that utilizes the comb structure of FIG. 8A. In FIG. 8B, a ground plane 813 and a power plane 811 are shown in a die mount area 821. The ground post connect locations 812 contact the ground plane 813. The power post connect locations 810 contact the power plane 811. Signal post connect locations 825 are coupled to signal pads 827 by signal traces 823. The comb structure with first fingers 808 and second fingers 806 interlaced results in the power post connects and the ground post connects being intermixed in the die mount area 821.

Figure 8C:
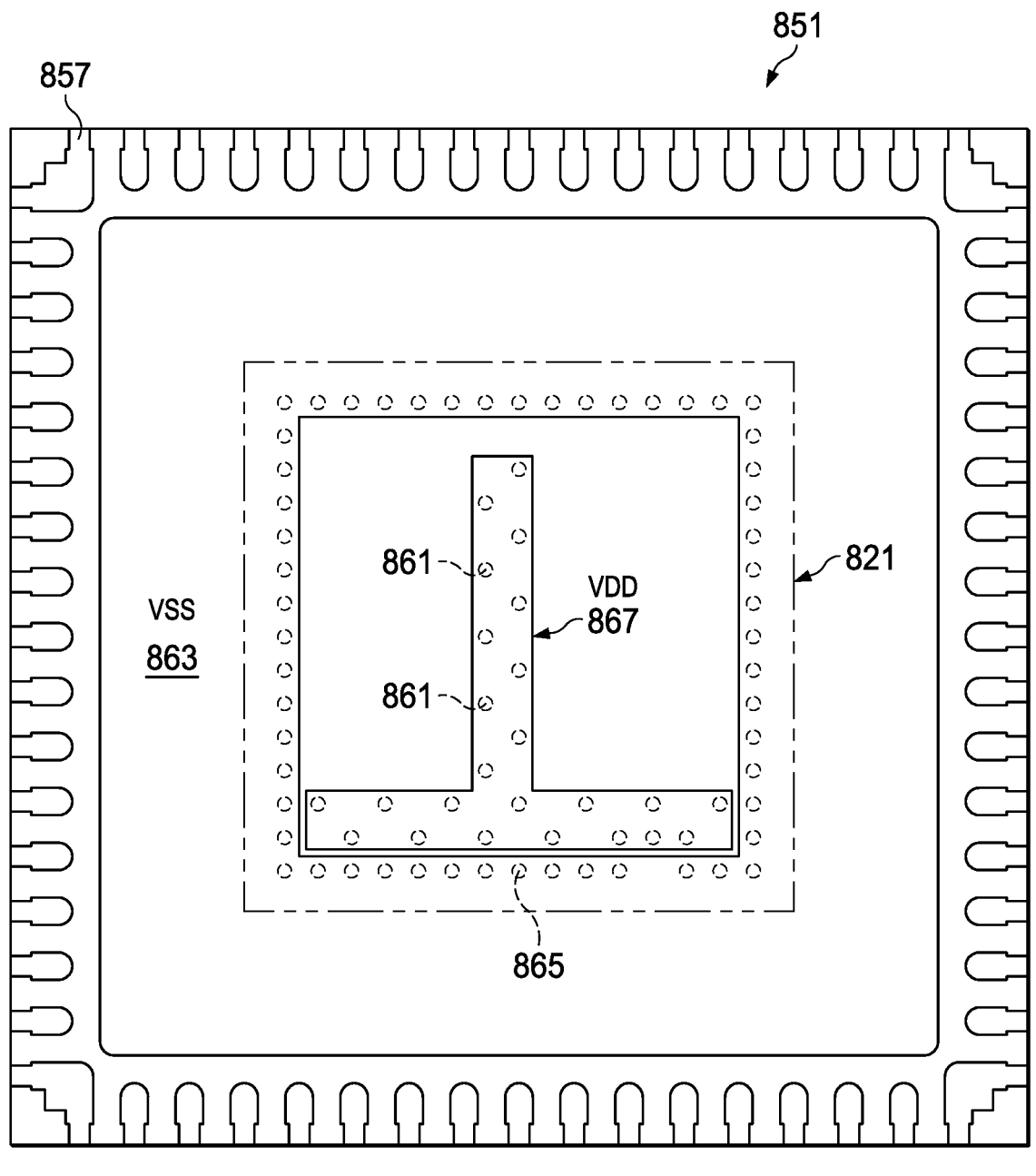

FIG. 8C illustrates, in another plan view, a first vertical connection layer 851 that couples to the first trace layer 817 in FIG. 8B. A ground conductor 863 is coupled by vertical connector locations 865 and maps the ground connection to a peripheral rectangle surrounding the die mount area 821, with power conductor 867 within the die mount area 821. The power conductor 867 is, in the illustrated example, a "T" shaped pattern, in alternative arrangements other patterns could be used. The power conductor 867 is coupled to the power plane 811 in FIG. 8A by vertical connections 861. The vertical connection layer also has signal pads 857 which map the signal connections through the vertical connection layer 851.

Figure 8D:
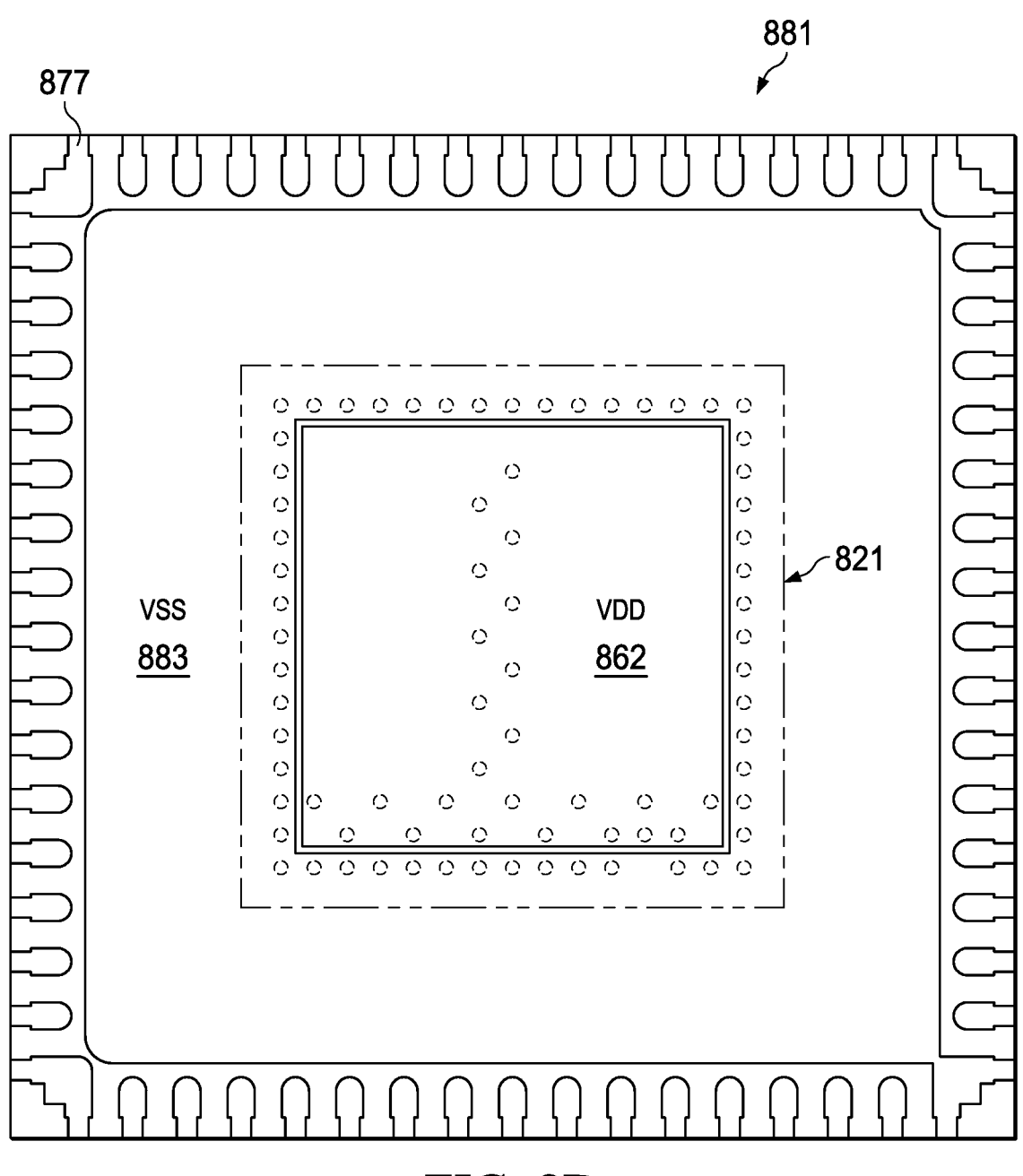

FIG. 8D illustrates, in a plan view, a second conductive layer 881 of the multilayer substrate. In FIG. 8D, the second conductive layer 881 includes the signal pads 877 that extend the signal path through the layer, and power plane 862 is shown in the die mount area 821, while the ground plane 883 distributes the ground connection in the peripheral border around the power plane 862.

Figure 8E:
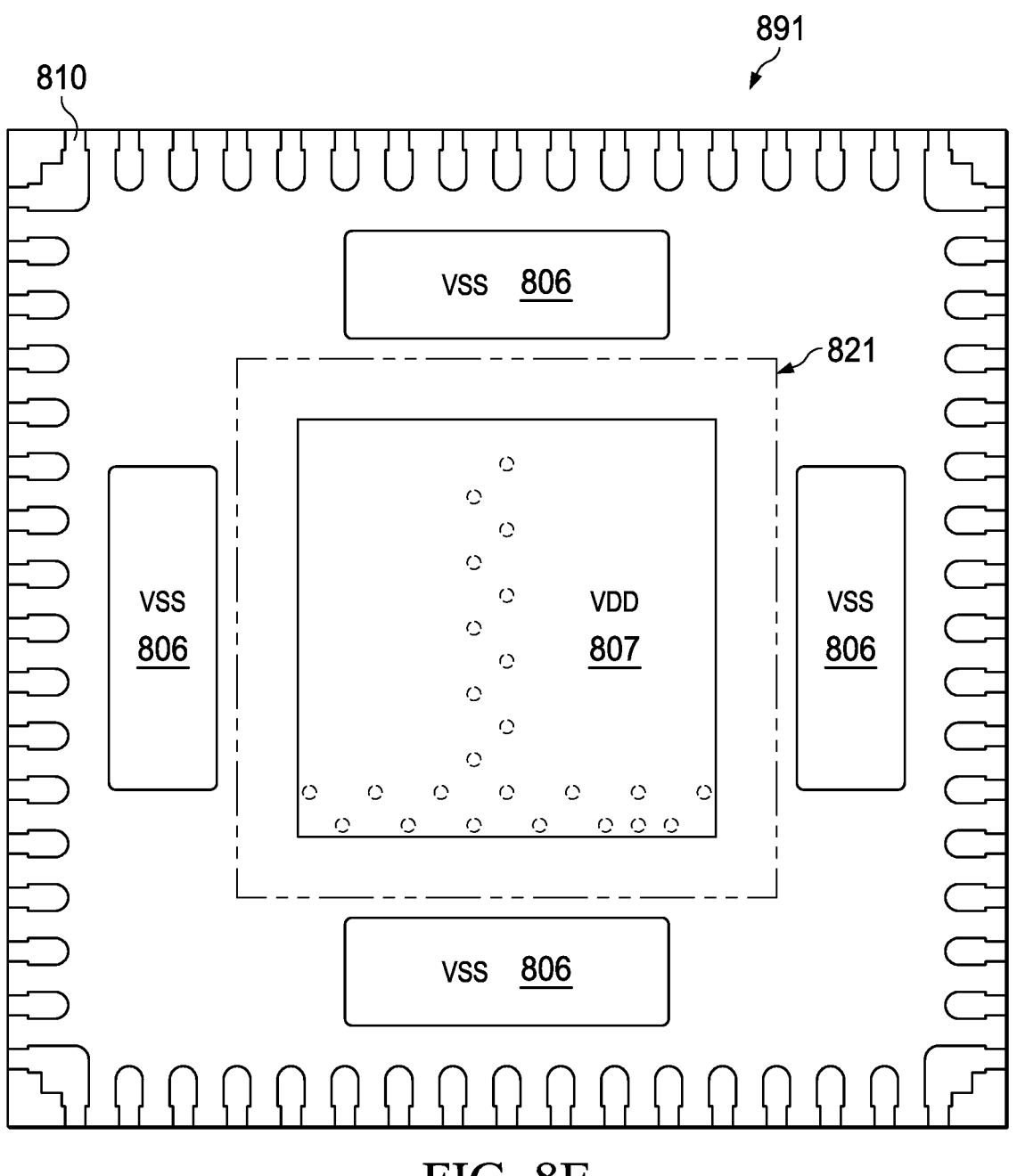

FIG. 8E illustrates, in another plan view, a second vertical connect layer 891 which in an example arrangement forms a board side surface of a multilayer package substrate (see, for example, 704 in FIG. 7B). Signal pads 810 form the external terminals for signals from the semiconductor device that is coupled from the first conductive trace layer 817 shown in FIG. 8B, the first vertical connection layer 851 shown in FIG. 8C, the second conductive trace layer 881 shown in FIG. 8D, and the second vertical connection layer 891. Ground pads 806 couple to the ground potential which is connected through the layers of the multilayer package substrate, and power pad 807 in the center of the board side surface and within the die mount area 821 is connects to the power potential through the layers. The ground pads 806 and the power pad 807 correspond to ground lands and power lands on a printed circuit board as shown in FIG. 3, pads 305, 306.

FIG. 9 illustrates, in a flow diagram, a method for forming an arrangement. At step 901, a semiconductor device is flip chip mounted to the die side surface of a multilayer substrate (see FIG. 5B, semiconductor device 102). The die side surface of the multilayer substrate has ground post connection locations and power post connection locations placed so that for a plurality of the post connection locations, the ground post connection locations and the power post connection locations are intermixed (see FIG. 7C, post connection locations 710, and 712). In one example the ground post connection locations are intermixed with power post connection locations in a mesh configuration, so that the power post connections can be made to a conductive trace layer that is a mesh structure. In another example, the ground post connection locations are placed along a first group of fingers in a conductor of a conductive trace layer, and the power post connection locations are placed along a second group of fingers a conductor of the conductive trace layer, and the first group and the second group of fingers are interlaced (see FIGS. 8A, 8B).

At step 903, a reflow step forms solder joints between the post connects extending from the semiconductor device to the die side surface of the multilayer package substrate to mount the semiconductor device.

At step 905, a mold compound covers the semiconductor device and the post connects and at least a portion of the die side surface of the multilayer package substrate.

At step 907, the packaged semiconductor devices are singulated one from another, for example by sawing through the multilayer package substrate, and the individual packaged semiconductor devices can be tested and completed.

Use of the arrangements provides a flip chip packaged semiconductor device with reduced loop inductance between power and ground connections. The use of the multilayer package substrates of the arrangements with signal redistribution within the multilayer package substrates enables power and ground pad patterns on printed circuit boards to be used with packages formed using the arrangements, without modifications to the printed circuit boards.

Modifications are possible in the described arrangements, and other alternative arrangements are possible within the scope of the claims.

What is claimed is:

1. An apparatus, comprising:
a multilayer package substrate comprising a die mount area on a die side surface and comprising power pads and ground pads on an opposing board side surface, the multilayer package substrate further comprising post connect locations on the die side surface configured for receiving power post connects and configured for receiving ground post connects for a semiconductor device, power post connect locations and ground post connect locations positioned in the die mount area, the power post connect locations and the ground post connect locations intermixed in the die mount area; and
the semiconductor device having post connects extending from bond pads on a device side surface, the semiconductor device flip chip mounted to the die side surface of the multilayer package substrate by solder joints formed between the post connects and the post connect locations.

2. The apparatus of claim 1, further comprising:
solder balls mounted to the power pads and the ground pads to form a ball grid array package.

3. The apparatus of claim 1, further comprising:
mold compound overlying the die side surface of the multilayer package substrate and the semiconductor device.

4. The apparatus of claim 3, further comprising terminals exposed from the mold compound on the board side surface of the multilayer package substrate to form a quad flat no-leads (QFN) package.

5. The apparatus of claim 1, wherein the multilayer package substrate comprises dielectric material that is acrylonitrile butadiene styrene (ABS), acrylic styrene acrylonitrile (ASA), liquid crystal polymer (LCP) or epoxy resin mold compound.

6. The apparatus of claim 1, wherein the ground post connect locations and the power post connect locations on the die side surface of the multilayer package substrate are positioned with the power post connect locations in a mesh structure, and the ground post connect locations are positioned in openings in the mesh structure.

7. The apparatus of claim 1, wherein the ground post connect locations are positioned in a comb structure with a plurality of first fingers extending from a first side of the die mount area, and the power post connect locations are positioned in the comb structure with a plurality of second fingers extending from a second side of the die mount area opposite the first side, the plurality of first fingers and the plurality of second fingers being interlaced.

8. The apparatus of claim 1, wherein the ground post connect locations in the die mount area are positioned so that for a plurality of the ground post connect locations, one of the power post connect locations is within three post connect locations.

9. The apparatus of claim 1, wherein a distance between a ground post connect location and a power post connect location in the die mount area is between 5 microns and 100 microns.

10. The apparatus of claim 1, wherein the multilayer package substrate further comprises:
a first conductive trace layer on the die side surface, the first conductive trace layer in a first layer of dielectric including the post connect locations configured to receive the ground post connects and the power post connects, the ground post connect locations electrically isolated from the power post connect locations by the first layer of dielectric;
a first vertical connection layer underlying the first conductive trace layer and having conductor patterns in a second layer of dielectric, portions of the first vertical connection layer connected to the power post connect locations on the first conductive trace layer to form power connections, and portions of the first vertical connection layer connected to the ground post connect locations on the first conductive trace layer to form ground connections;
a second conductive trace layer underlying the first vertical connection layer, the second conductive trace layer having conductors in a third layer of dielectric, the second conductive trace layer comprising a ground plane connected to the ground connections of the first vertical connection layer for carrying a ground potential, and the second conductive trace layer further comprising a power plane connected to the power connections of the first vertical connection layer for carrying a power potential; and a second vertical connection layer in a fourth layer of dielectric, the second vertical connection layer comprising one or more of the ground pads coupled to the ground plane of the second conductive trace layer, and the second vertical connection layer comprising one or more of the power pads coupled to the power plane of the second conductive trace layer.

11. The apparatus of claim 10, wherein the first layer of dielectric comprises acrylonitrile butadiene styrene (ABS), acrylic styrene acrylonitrile (ASA), liquid crystal polymer (LCP) or epoxy resin mold compound.

12. The apparatus of claim 10, wherein the first conductive trace layer comprises copper, tungsten, gold, aluminum, or combinations or alloys thereof.

13. The apparatus of claim 1, wherein the post connects comprise a conductive post of copper, gold, or alloys thereof.

14. The apparatus of claim 1, wherein the solder joints comprise tin silver (SnAg) or tin silver copper (SnAgCu) solder.

15. A multilayer package substrate, comprising:

a die mount area on a die side surface and power pads and ground pads on an opposing board side surface, the multilayer package substrate further comprising post connect locations on the die side surface configured for receiving power post connects and for receiving ground post connects for mounting a flip chip mounted semiconductor device, power post connect locations and ground post connect locations intermixed in the die mount area, wherein the multilayer package substrate further comprises:

a first conductive trace layer on the die side surface in a first layer of dielectric including the post connect locations configured to receive the ground post connects and the power post connects, the ground post connect locations electrically isolated from the power post connect locations by the first layer of dielectric;

a first vertical connection layer underlying the first conductive trace layer and having conductor patterns in a second layer of dielectric, portions of the first vertical connection layer connected to the power post connect locations on the first conductive trace layer to form power connections, and portions of the first vertical connection layer connected to the ground post connect locations on the first conductive trace layer to form ground connections;

a second conductive trace layer underlying the first vertical connection layer, the second conductive trace layer having conductors in a third layer of dielectric, the second conductive trace layer comprising a ground plane connected to the ground connections of the first vertical connection layer for carrying a ground potential, and the second conductive trace layer further comprising a power plane connected to the power connections of the first vertical connection layer for carrying a power potential; and a second vertical connection layer in a fourth layer of dielectric comprising one or more of the ground pads coupled to the ground plane of the second conductive trace layer, and the second vertical connection layer comprising one or more of the power pads coupled to the power plane of the second conductive trace layer.

16. The multilayer package substrate of claim 15, wherein the first layer of dielectric comprises acrylonitrile butadiene styrene (ABS), acrylic styrene acrylonitrile (ASA), liquid crystal polymer (LCP) or epoxy resin mold compound.

17. The multilayer package substrate of claim 15, wherein the first conductive trace layer comprises copper, tungsten, gold, aluminum, or combinations or alloys thereof.

18. The multilayer package substrate of claim 15, wherein the ground post connect locations and the power post connect locations on the die side surface of the multilayer package substrate are positioned to be intermixed in a mesh structure.

19. The multilayer package substrate of claim 15, wherein the ground post connect locations are positioned in a comb structure with a plurality of first fingers extending from a first side of the die mount area, and the power post connect locations are positioned in the comb structure with a plurality of second fingers extending from a second side of the die mount area opposite the first side, the plurality of first fingers and the plurality of second fingers being interlaced.

20. A method of manufacturing a semiconductor package, comprising:

positioning a semiconductor device having post connects extending from bond pads on a device side surface of the semiconductor device over a die mount area on a multilayer package substrate, the multilayer package substrate comprising a die side surface with the die mount area and power pads and ground pads on an opposing board side surface, the multilayer package substrate further comprising post connect locations on the die side surface configured for receiving power post connects and for receiving ground post connects for the semiconductor device, power post connect locations and ground post connect locations positioned in the die mount area, the power post connect locations and the ground post connect locations intermixed in the die mount area;

forming solder joints between the post connects extending from the semiconductor device and the post connect locations of the multilayer package substrate to electrically couple the semiconductor device to the multilayer package substrate; and covering the semiconductor device and the die side surface of the multilayer package substrate in mold compound.

* * * * *